US006393601B1

(12) United States Patent
Tanaka et al.

(10) Patent No.: US 6,393,601 B1
(45) Date of Patent: May 21, 2002

(54) LAYOUT DESIGNING APPARATUS FOR INTEGRATED CIRCUIT, TRANSISTOR SIZE DETERMINING APPARATUS, CIRCUIT CHARACTERISTIC EVALUATING METHOD, AND TRANSISTOR SIZE DETERMINING METHOD

(75) Inventors: Masakazu Tanaka; Masahiro Fukui, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/034,382

(22) Filed: Mar. 4, 1998

(30) Foreign Application Priority Data

Apr. 14, 1997 (JP) .............................................. 9-095439

(51) Int. Cl.[7] .............................................. G06F 17/50

(52) U.S. Cl. ......................................................... 716/2

(58) Field of Search ............................. 703/14; 716/12, 716/8, 2, 5, 7

(56) References Cited

U.S. PATENT DOCUMENTS

| 4,827,428 A | | 5/1989 | Dunlop et al. | |
| 5,838,947 A | * | 11/1998 | Sarin ........................... | 703/14 |
| 6,006,024 A | * | 12/1999 | Guruswamy .................. | 716/12 |
| 6,163,877 A | * | 12/2000 | Gupta ........................... | 716/8 |

FOREIGN PATENT DOCUMENTS

| JP | 05063081 | 12/1993 |
| JP | 07094591 | 7/1995 |
| JP | 08083302 | 3/1996 |
| JP | 08316326 | 11/1996 |

OTHER PUBLICATIONS

J.P. Fishburn, et al., "TILOS: A Posynomial Programming Approach to Transistor Sizing", Proc. of IEEE, pp. 326–328, 1985.

M. Yamada, et al., "Synergistic Power/Area Optimization with Transistor Sizing and Wire Length Minimization", IEICE Trans. Electron., vol. E78–C, No. 4, pp. 441–446, Apr. 1995.

M. Tanaka, et al., "A Transistor Sizing Algorithm Incorporating Layout Information", Technical Report of IEICE, VLD96–100, ICD96–210, pp. 31–38, 1997–03.

* cited by examiner

Primary Examiner—Matthew Smith
Assistant Examiner—Thuan Do
(74) Attorney, Agent, or Firm—McDermott, Will & Emery

(57) ABSTRACT

The present invention realizes the optimization of a transistor size with higher precision and in a shorter time, in designing a layout for an integrated circuit. A diffusion sharing estimation section estimates a diffusion-sharing region in the layout of the integrated circuit based on circuit data. A circuit characteristic evaluation section evaluates the characteristics, such as area, delay and power consumption, of the integrated circuit in accordance with the information about the diffusion-sharing region estimated by the diffusion sharing estimation section. A transistor size optimization section sets various size candidates for each of the transistors, which constitute the integrated circuit, provides these size candidates to the diffusion sharing estimation section and the circuit characteristic evaluation section, and then selects an optimum transistor size from the transistor size candidates thus set in accordance with the evaluation results obtained by the circuit characteristic evaluation section. Thus, a transistor size can be determined while taking the diffusion sharing into consideration. In addition, unlike a conventional method, it is no longer necessary to repeatedly re-determine a transistor size and perform a compaction.

7 Claims, 24 Drawing Sheets

Fig. 4

| PARAMETER | VALUE |
|:---:|:---:|
| R0 | 30 |
| C0 | 1.0 |
| Hp | 4.8 |
| Hn | 3.2 |
| Lt | 1.3 |
| Ld | 0.6 |
| S | 0.4 |
| F | 0.3 |
| P | 0.3 |

Fig. 11

| TRANSISTOR | W |
|---|---|
| tr1 | 3.0 |
| tr2 | 5.0 |
| tr3 | 3.0 |
| tr4 | 3.0 |

Fig. 12

| TRANSISTOR | NUMBER OF FOLDED SECTIONS |
|---|---|
| tr1 | 1 |
| tr2 | 2 |
| tr3 | 1 |
| tr4 | 1 |

Fig. 13

| TRANSISTOR S/D | TRANSISTOR S/D |
|---|---|
| tr3    S | tr4    D |
|  |  |

Fig. 15

| TRANSISTOR | AREA |
|:---:|:---:|
| tr1 | 3.9 |
| tr2 | 5.0 |
| tr3 | 2.7 |
| tr4 | 2.7 |
| total | 14.3 |

Fig. 17

| PATH | DELAY |
|------|-------|
| Da/f | 114 |
| Db/f | 102 |
| Da/r | 51 |
| Db/r | 30.6 |
| MAX | 114 |

Fig. 19

| TRANSISTOR | W |
|---|---|
| tr1 | 4.4 |
| tr2 | 4.5 |
| tr3 | 3.0 |
| tr4 | 3.0 |

Fig. 20

| TRANSISTOR | NUMBER OF FOLDED SECTIONS |
|---|---|
| tr1 | 1 |
| tr2 | 1 |
| tr3 | 1 |
| tr4 | 1 |

Fig. 21

| TRANSISTOR | S/D | TRANSISTOR | S/D |
|---|---|---|---|
| tr3 | S | tr4 | D |
| tr1 | D | tr2 | D |

Fig. 22

| TRANSISTOR | AREA |
|---|---|
| tr1 | 4.4 |
| tr2 | 4.5 |
| tr3 | 2.7 |
| tr4 | 2.7 |
| total | 14.3 |

Fig. 23

| PATH | DELAY |
|---|---|
| Da/f | 101.4 |
| Db/f | 89.4 |
| Da/r | 30.5 |
| Db/r | 29.8 |
| MAX | 101.4 |

D6    D7    D8    D9

D6    D7, D8    D9

LAYOUT DESIGNING APPARATUS FOR INTEGRATED CIRCUIT, TRANSISTOR SIZE DETERMINING APPARATUS, CIRCUIT CHARACTERISTIC EVALUATING METHOD, AND TRANSISTOR SIZE DETERMINING METHOD

BACKGROUND OF THE INVENTION

The present invention relates to designing a layout for a semiconductor integrated circuit. More specifically, the present invention relates to technologies for determining an optimum transistor size in designing a layout.

In a conventional method for designing a layout for a semiconductor integrated circuit, first, the size of each of the transistors, constituting the integrated circuit, is determined before the layout designing is started. Thereafter, the arrangement of the transistors and the wiring among the transistors are performed based on the determined transistor size.

In arranging the transistors, a technique called "diffusion sharing", in which one and the same diffusion region is shared among a plurality of transistors having an equal potential, is generally used in order to reduce the diffusion capacitance between these transistors and to reduce the area occupied by these transistors on a chip. If there is any transistor having a gate, which is larger in size than the arrangement region assigned thereto, then such a transistor is divided into several smaller transistor sections. In such a case, it is also common that one and the same diffusion region is shared among the transistor sections. Such a division of a large-size transistor into smaller transistor sections is called a "transistor folding" technique. In this specification, the smaller transistor sections, which have been divided from one large-size transistor, will be called "transistor folded sections" and the number of such sections will be called a "number of transistor folded sections".

On the other hand, the methods for determining the transistor size include: a method for determining the size of a transistor based on simple equations by assuming the area and the diffusion capacitance of the transistor to be proportional to the size of the transistor (disclosed by Fishburn et al., in "TILOS: A Posynomial Programming Approach to Transistor Sizing", ICCAD 85, pp. 326–328, 1985); a method in which the size determination and the compaction of a transistor are repeatedly performed by using the real capacitance (obtained after the layout has been designed) as the diffusion capacitance (disclosed by Yamada et al., in "Synergistic Power/Area Optimization with Transistor Sizing and Wire Length Minimization", IEICE Trans. Electron., Vol. E78-C, No. 4, pp. 441–446, 1995); and the like.

In accordance with these conventional layout designing methods, however, the number of transistor folded sections cannot be optimized by using, as design indices, the area occupied by the transistors and the resulting circuit characteristics such as the delay performance thereof. Thus, the conventional methods have no choice other than designing a layout by using a non-optimized transistor size and a non-fixed number of transistor folded sections, or re-determining the transistor size after the transistors have been arranged once, in order to optimize the transistor size and the number of folded sections.

Moreover, in the conventional methods for determining a transistor size, the decrease in area and diffusion capacitance of the transistors, resulting from the serial connection, the folding and the like of the transistors, are not taken into consideration. Thus, the transistor size cannot be optimized with high precision. For example, the method of Fishburn et al. can determine a transistor size in a relatively short time. However, since the method of Fishburn et al. does not take the diffusion sharing among the transistors, which is implemented when the transistors are actually laid out, into consideration at all, the transistor size cannot be optimized with high precision. On the other hand, the method of Yamada et al. is a combination of the conventional compaction technique and the method of Fishburn et al., and does take the diffusion sharing into consideration. However, in accordance with the method of Yamada et al., since the size determination and the compaction of a transistor need to be repeated many times, an enormous amount of time is required for processing. Furthermore, the method of Yamada et al. cannot optimize the transistor size and the number of transistor folded sections simultaneously.

SUMMARY OF THE INVENTION

An objective of the present invention is optimizing the size and the number of folded sections of each of the transistors, constituting an integrated circuit, without re-setting the transistor size in designing a layout for the integrated circuit.

Another objective of the present invention is optimizing a transistor size with higher precision and in a shorter time, as compared with a conventional method, in determining the transistor size for designing a layout for an integrated circuit.

Still another objective of the present invention is providing a circuit characteristic evaluating method, which can optimize a transistor size with higher precision and in a shorter time, as compared with a conventional method.

Specifically, the present invention provides a layout designing apparatus for an integrated circuit receiving circuit data representing a configuration of the integrated circuit to be designed and technology data representing information about a semiconductor fabrication process. The layout designing apparatus includes: transistor size determination means for determining a size and a number of folded sections of each of a plurality of transistors, which constitute the integrated circuit, based on the circuit data and the technology data, while evaluating characteristics of the integrated circuit; and layout means for determining an arrangement of the transistors and wiring among the transistors, based on the circuit data, the technology data, the transistor size and the number of folded sections, which size and number have been determined by the transistor size determination means, thereby producing a layout for the integrated circuit.

In the layout designing apparatus for an integrated circuit, before the layout is produced, the transistor size determination means can determine the size and the number of folded sections of each of the transistors, which constitute the integrated circuit to be designed, while evaluating the characteristics of the integrated circuit. Thus, the size and the number of folded sections of each transistor can be optimized without re-determining the transistor size.

In one embodiment of the present invention, the transistor size determination means of the layout designing apparatus for an integrated circuit preferably includes: diffusion sharing estimation means for estimating, based on the circuit data, a diffusion-sharing region where diffusion sharing is implemented in the layout of the integrated circuit, when a given transistor size candidate is employed; circuit characteristic evaluation means for evaluating the characteristics of the integrated circuit when the given transistor size candidate is employed, based on the circuit data, the technology data and information about the diffusion-sharing region estimated by the diffusion sharing estimation means; and transistor size optimization means for setting transistor size candidates of the integrated circuit, in which the given transistor size candidate is included, providing the size candidates to the diffusion sharing estimation means and the circuit characteristic evaluation means, and then selecting an optimum transistor size from the transistor size candidates based on evaluation results of the circuit characteristic evaluation means.

In such a configuration, when a transistor size candidate is given by the transistor size optimization means, the diffusion sharing estimation means estimates the diffusion-sharing region and the circuit characteristic evaluation means evaluates the characteristics of the integrated circuit in consideration of the information about the diffusion-sharing region estimated by the diffusion sharing estimation means. In this manner, by making the transistor size optimization means set various transistor size candidates and select an optimum transistor size from the various transistor size candidates based on the evaluation results obtained by the circuit characteristic evaluation means, the transistor size can be determined in view of the diffusion sharing. Furthermore, since the size determination and the compaction of a transistor need not be repeated unlike a conventional method, the transistor size can be optimized with higher precision and in a shorter time as compared with a conventional method.

The present invention also provides a transistor size determining apparatus for determining a size of each of a plurality of transistors constituting an integrated circuit to be designed. The transistor size determining apparatus receives circuit data representing a configuration of the integrated circuit and technology data representing information about a semiconductor fabrication process. The transistor size determining apparatus includes: diffusion sharing estimation means for estimating, based on the circuit data, a diffusion-sharing region where diffusion region is implemented in the layout of the integrated circuit, when a given transistor size candidate is employed; circuit characteristic evaluation means for evaluating the characteristics of the integrated circuit when the given transistor size candidate is employed, based on the circuit data, the technology data and information about the diffusion-sharing region estimated by the diffusion sharing estimation means; and transistor size optimization means for setting transistor size candidates of the integrated circuit, in which the given transistor size candidate is included, providing the size candidates to the diffusion sharing estimation means and the circuit characteristic evaluation means, and then selecting an optimum transistor size from the transistor size candidates based on evaluation results of the circuit characteristic evaluation means.

In the transistor size determining apparatus, when a transistor size candidate is given by the transistor size optimization means, the diffusion sharing estimation means estimates the diffusion-sharing region and the circuit characteristic evaluation means evaluates the characteristics of the integrated circuit in consideration of the information about the diffusion-sharing region estimated by the diffusion sharing estimation means. In this manner, by making the transistor size optimization means set various transistor size candidates and select an optimum transistor size from the various transistor size candidates based on the evaluation results obtained by the circuit characteristic evaluation means, the transistor size can be determined in view of the diffusion sharing. Furthermore, since the size determination and the compaction of a transistor need not be repeated unlike a conventional method, the transistor size can be optimized with higher precision and in a shorter time as compared with a conventional method.

In one embodiment of the present invention, the diffusion sharing estimation means preferably estimates, as the diffusion-sharing region, at least one of: two mutually-connected diffusion regions of serially-connected transistors; two mutually-connected diffusion regions of transistors which are connected to each other via a branch; and one of diffusion regions of a transistor which is estimated to be folded.

The present invention also provides a circuit characteristic evaluating method for evaluating the characteristics of an integrated circuit to be designed. The method includes: a diffusion sharing estimation step of estimating, based on circuit data representing a configuration of the integrated circuit, a diffusion-sharing region where diffusion sharing is implemented in the layout of the integrated circuit, when a given transistor size is employed; and a circuit characteristic evaluation step of evaluating the characteristics of the integrated circuit when the given transistor size is employed, based on the circuit data, technology data representing information about a semiconductor fabrication process and information about the diffusion-sharing region estimated by the diffusion sharing estimation step.

In the circuit characteristic evaluating method, when a transistor size is given, the diffusion-sharing region is estimated in the diffusion sharing estimation step. And in the circuit characteristic evaluation step, the characteristics of the integrated circuit are evaluated in consideration of the information about the diffusion-sharing region estimated in the diffusion sharing estimation step. In this manner, by performing the circuit characteristic evaluating method for various transistor sizes and by selecting an optimum transistor size from the various transistor sizes based on the evaluation results obtained by performing the circuit characteristic evaluation step, the transistor size can be determined in view of the diffusion sharing. Furthermore, since the size determination and the compaction of a transistor need not be repeated unlike a conventional method, the transistor size can be optimized with higher precision and in a shorter time as compared with a conventional method.

In one embodiment of the present invention, at least one of: two mutually-connected diffusion regions of serially-connected transistors; two mutually-connected diffusion regions of transistors which are connected to each other via a branch; and one of diffusion regions of a transistor which is estimated to be folded, is preferably estimated as the diffusion-sharing region in the diffusion sharing estimation step.

In another embodiment of the present invention, in the diffusion sharing estimation step, a probability of diffusion sharing is preferably calculated with respect to a net connecting a plurality of diffusion regions to each other, and the probability is preferably estimated as a probability that the diffusion sharing is implemented in the respective diffusion regions belonging to the net.

In still another embodiment of the present invention, the circuit characteristic evaluation step preferably includes an area estimation step of estimating, as an index for evaluating the characteristics of the integrated circuit, a layout area of the integrated circuit. The area estimation step preferably includes: a first step of calculating an area of a transistor which has been estimated not to involve diffusion sharing in the diffusion sharing estimation step; and a second step of calculating an area of a transistor, which has been estimated to involve the diffusion sharing in the diffusion sharing estimation step, in consideration of a decrement of the area of the transistor resulting from the diffusion sharing. The area of the integrated circuit is preferably calculated by using the areas of the respective transistors, which are calculated in the first and the second steps.

In still another embodiment of the present invention, the area estimation step preferably further includes a third step of calculating, as a first layout area, the area of the integrated circuit resulting from an assumption that the respective transistors are one-dimensionally arranged. The layout area of the integrated circuit is preferably estimated based on the first layout area and a second layout area which is obtained from a sum of the areas of the respective transistors calculated in the first and the second steps.

The present invention further provides a transistor size determining method for determining a size of each of a plurality of transistors, constituting an integrated circuit, in designing a layout for the integrated circuit. The transistor size determining method includes: a diffusion sharing estimation step of estimating, based on circuit data representing a configuration of the integrated circuit, a diffusion-sharing region where diffusion sharing is implemented in the layout of the integrated circuit, when a given transistor size candidate is employed; and a circuit characteristic evaluation step of evaluating the characteristics of the integrated circuit when the given transistor size candidate is employed, based on the circuit data, technology data representing information about a semiconductor fabrication process and information about the diffusion-sharing region estimated by the diffusion sharing estimation step. The diffusion sharing estimation step and the circuit characteristic evaluation step are performed for a plurality of transistor size candidates, and an optimum transistor size is determined based on the evaluation results obtained by the circuit characteristic evaluation step.

In the transistor size determining method, when a transistor size candidate is given, the diffusion-sharing region is estimated in the diffusion sharing estimation step. And in the circuit characteristic evaluation step, the characteristics of the integrated circuit are evaluated in consideration of the information about the diffusion-sharing region estimated in the diffusion sharing estimation step. In this manner, by performing the diffusion sharing estimation step and the circuit characteristic evaluation step for various transistor size candidates and by selecting an optimum transistor size from the various transistor size candidates based on the evaluation results obtained by performing the circuit characteristic evaluation step, the transistor size can be determined in view of the diffusion sharing. Furthermore, since the size determination and the compaction of a transistor need not be repeated unlike a conventional method, the transistor size can be optimized with higher precision and in a shorter time as compared with a conventional method.

In one embodiment of the transistor size determining method of present invention, the diffusion sharing estimation step and the circuit characteristic evaluation step are preferably performed repeatedly so as to optimize predetermined evaluation indices, while employing different transistor size candidates one after another. The transistor size candidates are preferably different from each other by a predetermined value and the value is preferably variable in accordance with a variation of the predetermined evaluation indices.

BRIEF DESCRIPTION OF THE DRAWINGS

FIG. 4 is a table showing exemplary technology data.

FIG. 5A shows a layout for a case where diffusion sharing is implemented by folding a transistor or connecting drains; FIG. 5B shows a layout for a case where diffusion sharing is not implemented; and FIG. 5C shows a layout for a case where diffusion sharing is implemented by a serial connection.

FIG. 11 is a table showing exemplary initial values of transistor size candidates for the circuit data shown in FIG. 3.

FIG. 12 is a table showing exemplary information about the number of transistor folded sections.

FIG. 13 is a table showing exemplary information about diffusion sharing implemented by a connection.

FIG. 15 is a table showing exemplary calculation results obtained by the method for calculating an estimated area of an integrated circuit shown in FIG. 14.

FIG. 17 is a table showing exemplary calculation results obtained by the method for calculating an estimated delay of an integrated circuit shown in FIG. 16.

FIG. 19 is a table showing information about newly employed transistor sizes.

FIG. 20 is a table showing information about a newly employed number of transistor folded sections.

FIG. 21 is a table showing exemplary information about diffusion sharing implemented by a connection.

FIG. 22 is a table showing exemplary calculation results obtained by the method for calculating an estimated area of an integrated circuit shown in FIG. 14.

FIG. 23 is a table showing exemplary calculation results obtained by the method for calculating an estimated delay of an integrated circuit shown in FIG. 16.

FIG. 25A shows a layout before the diffusion sharing is implemented; and FIG. 25B shows a layout after the diffusion sharing has been implemented.

FIG. 26A shows a layout before the diffusion sharing is implemented; and FIG. 26B shows a layout after the diffusion sharing has been implemented.

DETAILED DESCRIPTION OF THE INVENTION

Hereinafter, an embodiment of the present invention will be described with reference to the accompanying drawings.

Figure 1:
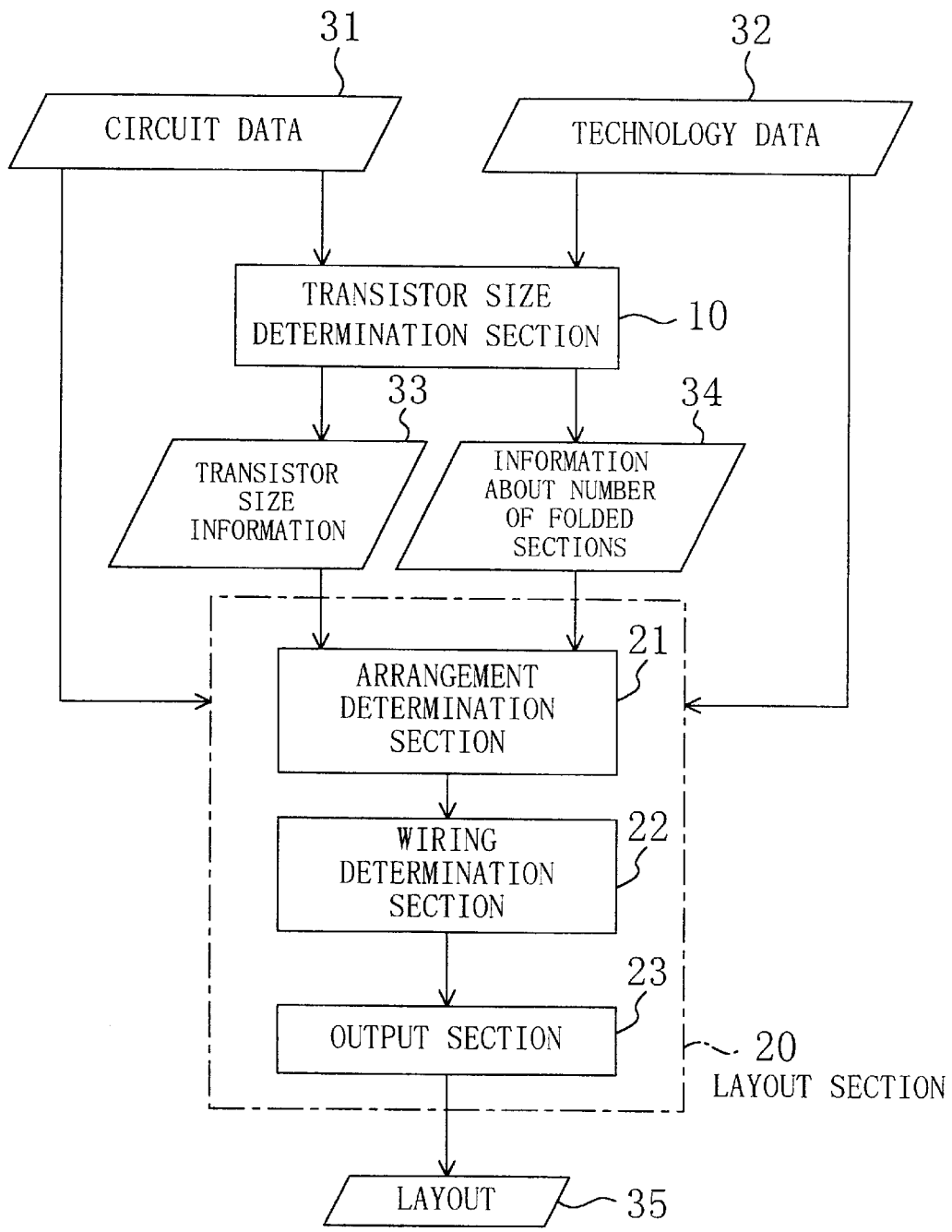
FIG. 1 is a block diagram showing a configuration of a layout designing apparatus for an integrated circuit in an embodiment of the present invention.

FIG. 1 is a block diagram showing a configuration of a layout designing apparatus for an integrated circuit in an embodiment of the present invention. In FIG. 1, the reference numeral 31 denotes circuit data representing transistors and external terminals constituting an integrated circuit to be designed and a connection relationship thereof. The reference numeral 32 denotes technology data representing the information about a semiconductor fabrication process such as resistance values of the transistors, design rules and the like. The reference numeral 10 denotes a transistor size determination section for optimizing the size and the number of folded sections of each of the transistors constituting the integrated circuit to be designed based on the circuit data 31 and the technology data 32. The reference numeral 33 denotes transistor size information which has been produced by the transistor size determination section 10 and which represents the size of each of the transistors constituting the integrated circuit. The reference numeral 34 denotes information about the number of folded sections which has been produced by the transistor size determination section 10 and which represents the number of folded sections of each of the transistors constituting the integrated circuit. The reference numeral 21 denotes an arrangement determination section for determining the arrangement of the transistors based on the circuit data 31, the technology data 32, and the transistor size information 33 and the information about the number of folded sections 34 which have been produced by the transistor size determination section 10. The reference numeral 22 denotes a wiring determination section for determining the wiring among the transistors based on the arrangement results determined by the arrangement determination section 21, the circuit data 31 and the technology data 32. The reference numeral 23 denotes an output section for producing and outputting an layout 35 for the integrated circuit based on the arrangement results determined by the arrangement determination section 21 and the wiring results determined by the wiring determination section 22. A layout section 20 is constituted by the arrangement determination section 21, the wiring determination section 22 and the output section 23.

Figure 2:
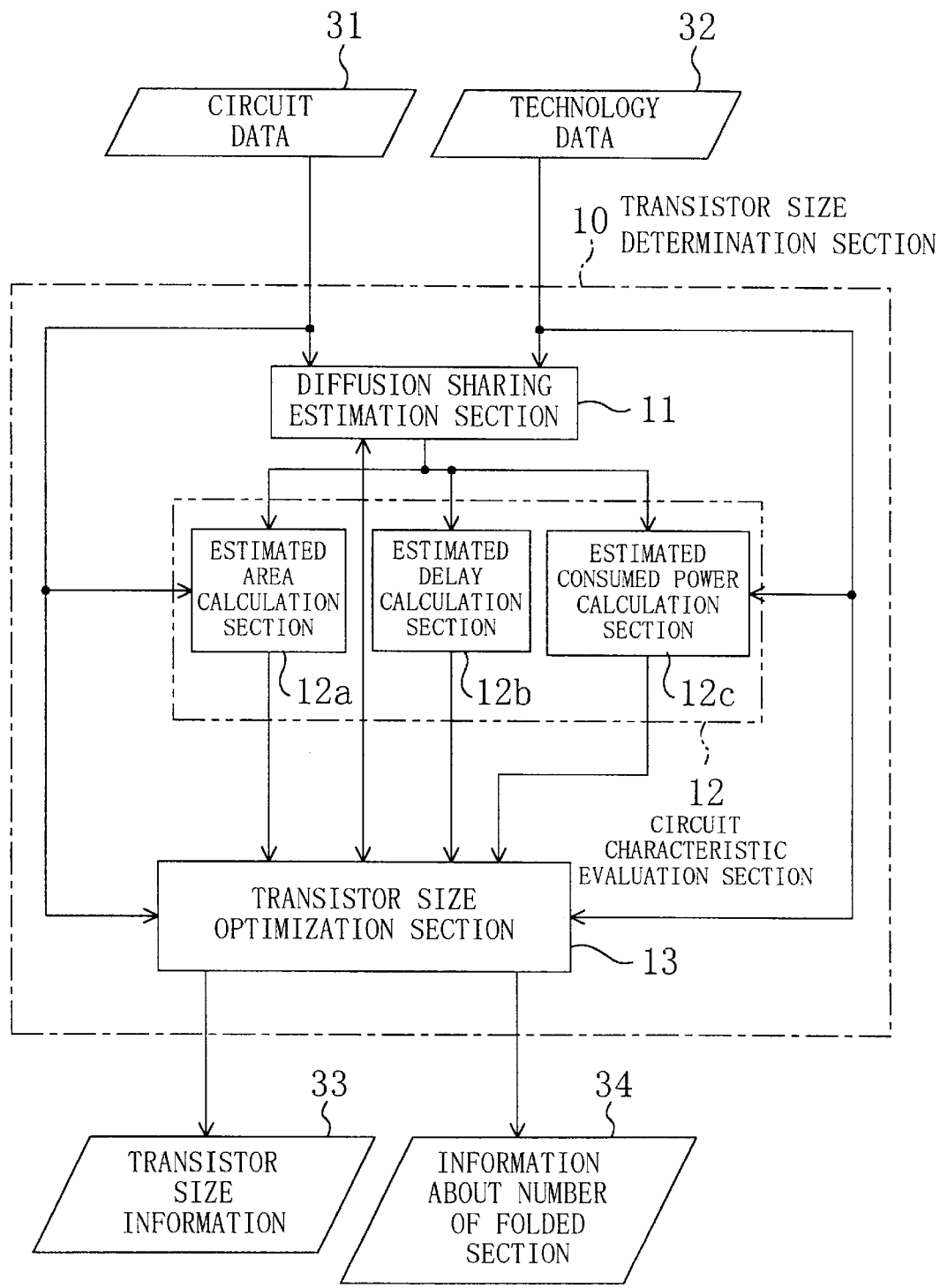
FIG. 2 is a block diagram showing a configuration of the transistor size determination section 10 of the layout designing apparatus in the embodiment shown in FIG. 1, which section is a transistor size determining apparatus in an embodiment of the present invention.

FIG. 2 is a block diagram showing a configuration of the transistor size determination section 10 of the layout designing apparatus for an integrated circuit in the embodiment shown in FIG. 1. In FIG. 2, the reference numeral 11 denotes a diffusion sharing estimation section for estimating the diffusion-sharing region where the diffusion sharing is implemented by the folding, the serial connection or the like of the transistors based on the circuit data 31 and the technology data 32. The reference numeral 12 denotes a circuit characteristic evaluation section for evaluating the characteristics, such as the area, of the integrated circuit based on the estimation results obtained by the diffusion sharing estimation section 11, the circuit data 31 and the technology data 32. The reference numeral 13 denotes a transistor size optimization section for determining an optimum transistor size and an optimum number of folded sections based on the evaluation results obtained by the circuit characteristic evaluation section 12. The circuit characteristic evaluation section 12 includes: an estimated area calculation section 12a for calculating an estimated area of the integrated circuit; an estimated delay calculation section 12b for calculating an estimated delay of the integrated circuit; and an estimated consumed power calculation section 12c for calculating estimated power consumed by the integrated circuit.

Hereinafter, the operation of the layout designing apparatus for an integrated circuit in the embodiment shown in FIG. 1 will be described.

First, the transistor size determination section 10 determines an optimum size and an optimum number of folded sections of each of the transistors constituting the integrated circuit based on the circuit data 31 and the technology data 32.

Figure 3:
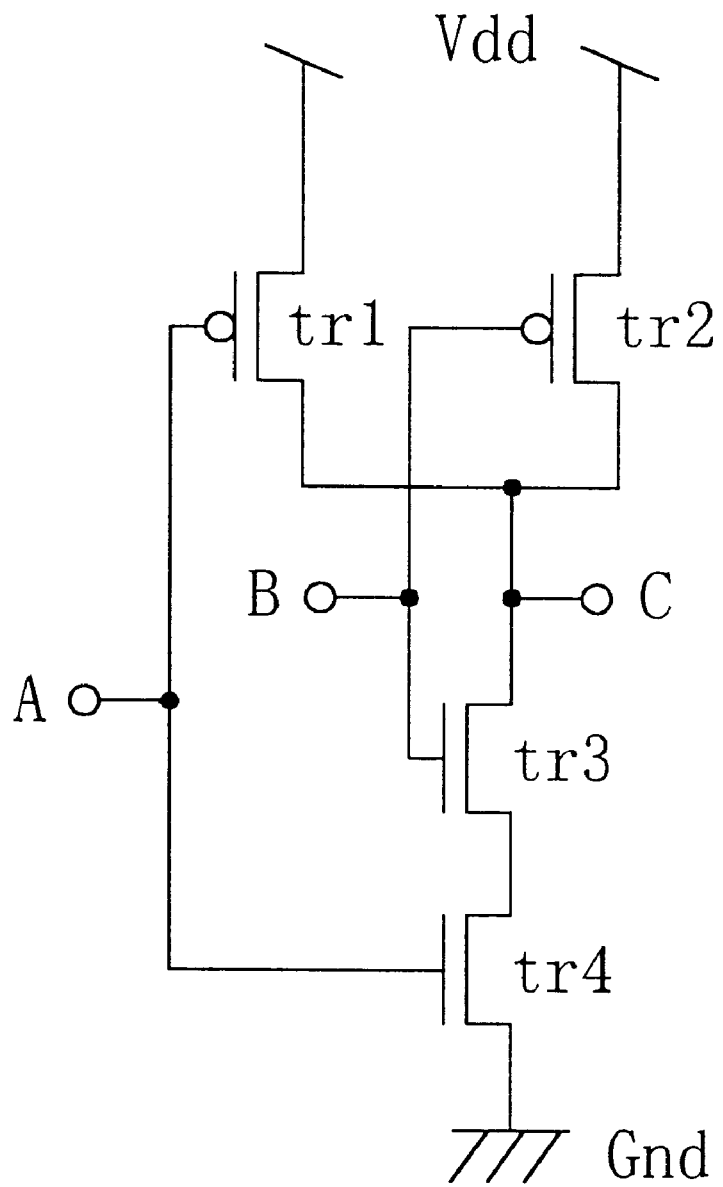
FIG. 3 is a circuit diagram showing exemplary circuit data.

FIG. 3 is a circuit diagram showing an example of the circuit data 31 for illustrating the present embodiment. In FIG. 3, tr1 and tr2 denote p-type transistors, tr3 and tr4 denote n-type transistors, A and B denote input pins and C denotes an output pin. The source of the transistor tr3 is connected to the drain of the transistor tr4, the sources of the transistors tr1 and tr2 are connected to a power supply line Vdd, and the source of the transistor tr4 is connected to a ground line Gnd. The input pin A is connected to the gates of the transistors tr1 and tr4, the input pin B is connected to the gates of the transistors tr2 and tr3, and the output pin C is connected to the drains of the transistors tr1, tr2 and tr3.

FIG. 4 is a table showing an example of the technology data 32 for illustrating the present embodiment. In FIG. 4, R0 denotes gate resistance per unit length of a transistor; C0 denotes diffusion capacitance per unit area of a transistor; Hp is the height of a p-type well; Hn is the height of an n-type well; Lt is a reference transistor length which is the length of a transistor involving no diffusion sharing; Ld is a reference diffusion region length which is the length of a diffusion region involving no diffusion sharing; S denotes a decrement of the length of the diffusion region which has been caused by the diffusion sharing implemented by a serial connection; F denotes a decrement of the length of the diffusion region which has been caused by the diffusion sharing implemented by the folding of a transistor; and P denotes a decrement of the length of the diffusion region which has been caused by the diffusion sharing implemented by a connection including a branch.

Figure 5A:
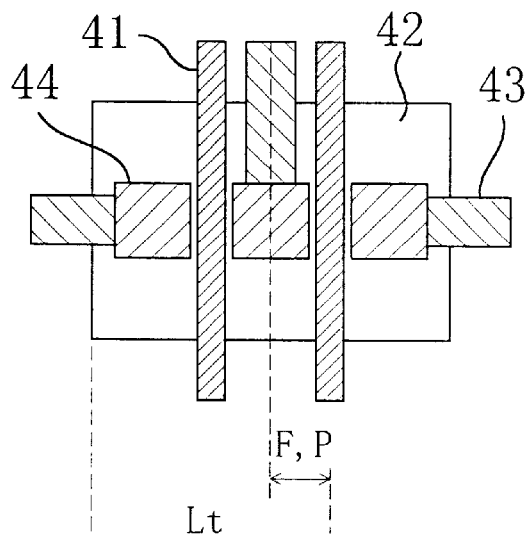
FIGS. 5A to 5C are plan views showing exemplary layouts of transistors and illustrating the parameters of the technology data.
Figure 5B:
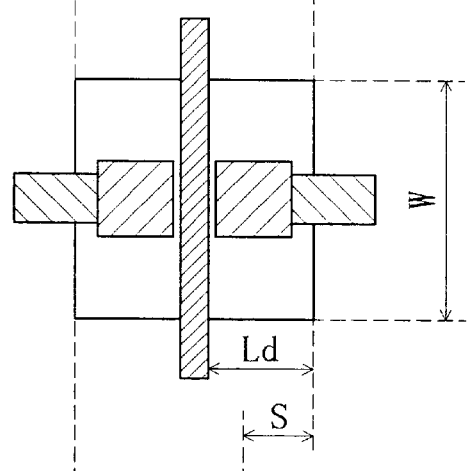
Figure 5C:
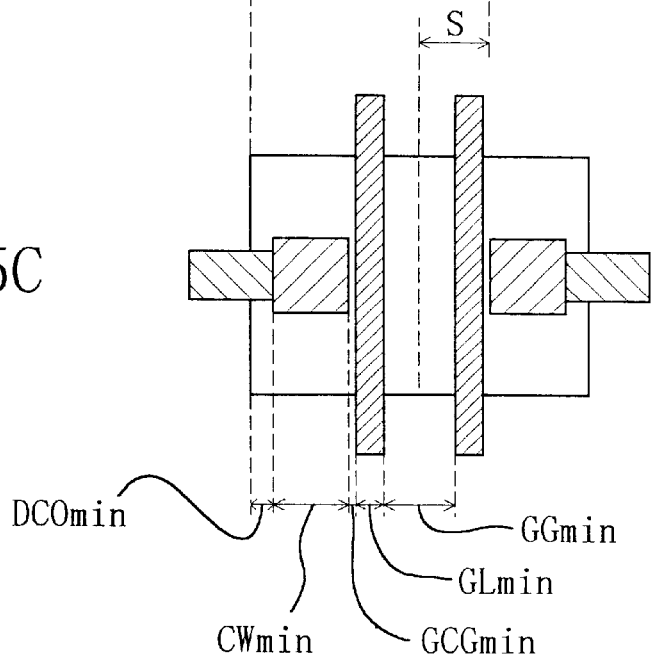

FIGS. 5A, 5B and 5C are plan views showing exemplary layouts of transistors for illustrating the parameters Lt, Ld, S, F and P of the technology data 32. FIG. 5A shows a layout for a case where diffusion sharing is implemented by the folding of a transistor or by the connection including a branch, FIG. 5B shows a layout for a case where no diffusion sharing is implemented and FIG. 5C shows a layout for a case where diffusion sharing is implemented by a serial connection. The reference numeral 41 denotes a gate of a transistor; 42 denotes a diffusion region of a transistor; 43 denotes an aluminum wire; and 44 denotes a contact connecting the diffusion region 42 of a transistor and the aluminum wire 43 to each other.

Assuming that a minimum gate length GLmin, a minimum contact width CWmin, a minimum gate gap GGmin, a minimum overlap width between diffusion region and contact DCOmin, and a minimum gate-contact gap GCGmin are given as design rules as shown in FIG. 5C, the respective parameters Lt, Ld, S, F and P of the technology data 32 are defined as follows.

$$Lt = GLmin + (CWmin + GCGmin + DCOmin) \times 2$$

$$Ld = CWmin + GCGmin + DCOmin$$

$$S = Ld - GGmin/2 = CWmin + GCGmin + DCOmin - GGmin/2$$

$$F, P = Ld - (CWmin/2 + GCGmin) = CWmin/2 + DCOmin$$

It is noted that W in FIG. 5B denotes a gate width of a transistor and that the transistor size is represented by the gate width W.

Figure 6:
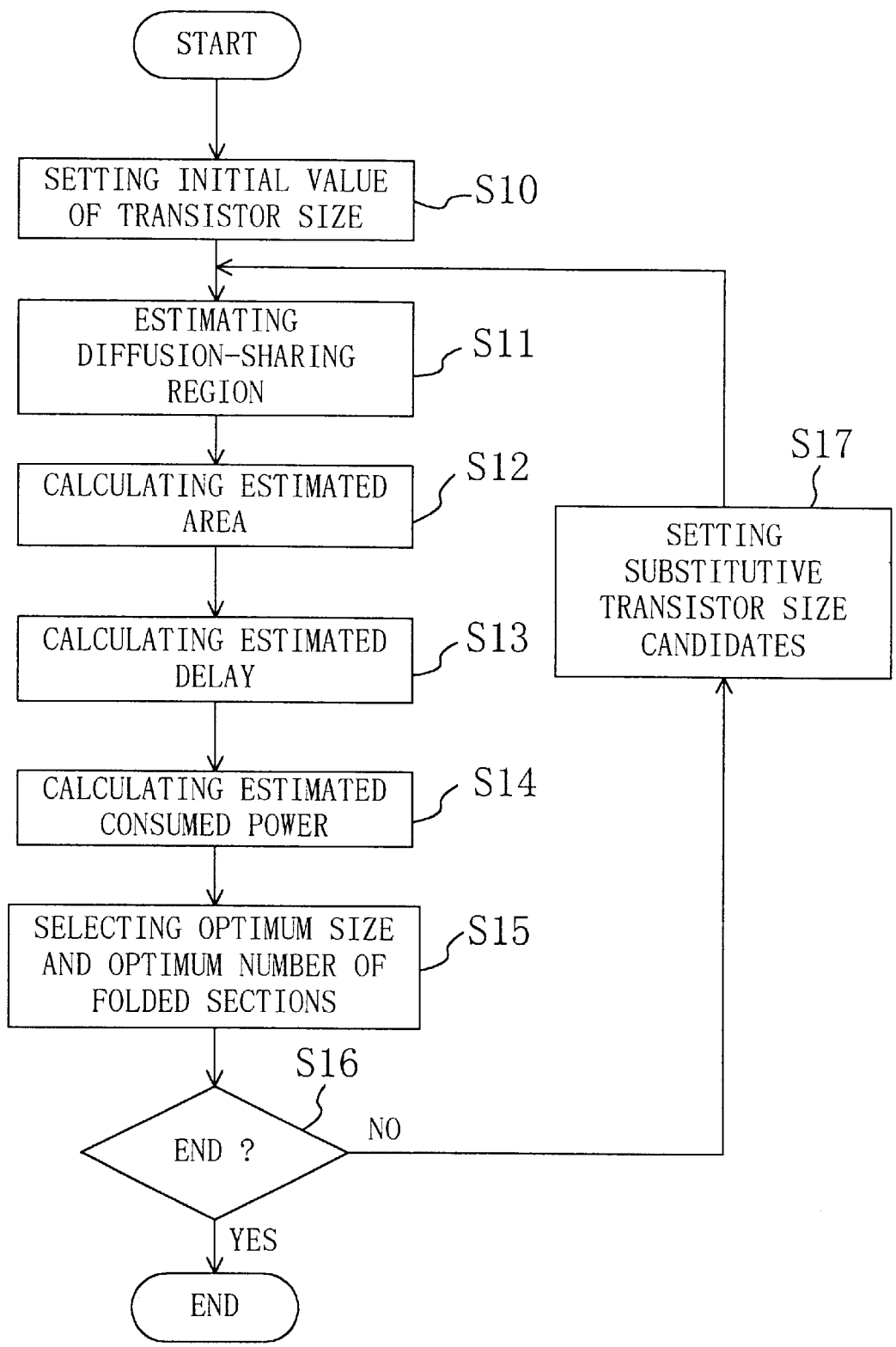
FIG. 6 is a flow chart showing the operation of the transistor size determination section 10 shown in FIG. 2, i.e., a transistor size determining method in an embodiment of the present invention.

FIG. 6 is a flow chart showing the operation of the transistor size determining section 10 shown in FIG. 2. As shown in FIG. 6, in Step S11, transistors to be folded, transistors to be serially connected to each other and transistors to be connected via a branch are detected based on the information about the given transistor size candidates and the configuration of the integrated circuit represented by the circuit data 31, thereby estimating a diffusion-sharing region. In Step S12, an estimated area of the integrated circuit is calculated based on the information about the transistor size candidates and the diffusion-sharing region estimated in Step S11. In Step S13, an estimated delay of the integrated circuit is calculated based on the technology data 32 and the information about the transistor size candidates and about the diffusion-sharing region estimated in Step S11. In Step S14, estimated power consumed by the integrated circuit is calculated based on the technology data 32 and the information about the transistor size candidates and about the diffusion-sharing region estimated in Step S11. That is to say, a diffusion sharing estimation step is constituted by Step S11 and a circuit characteristic evaluation step is constituted by Steps S12 to S14. A circuit characteristic evaluating method is constituted by the diffusion sharing estimation step and the circuit characteristic evaluation step.

Various techniques may be employed for optimization. In this embodiment, an optimum transistor size is to be determined by a method in which the transistor size is sequentially improved by selectively providing an appropriate initial value from the transistor size candidates in Step S10 and then by substituting various values at random in Step S17. The delay of a critical path is defined as an optimization index, and the transistor size and the number of folded sections are to be optimized so as to minimize the delay of the critical path.

Diffusion Sharing Estimation Step

First, in Step S11, the diffusion sharing estimation section 11 estimates a diffusion-sharing region between transistors based on the circuit data 31 such as that shown in FIG. 3 and the technology data 32 such as that shown in FIG. 4. When Step S11 is completed, the diffusion sharing estimation section 11 outputs the information about the number of transistor folded sections and the information about the diffusion-sharing implemented by a connection.

Figure 7:
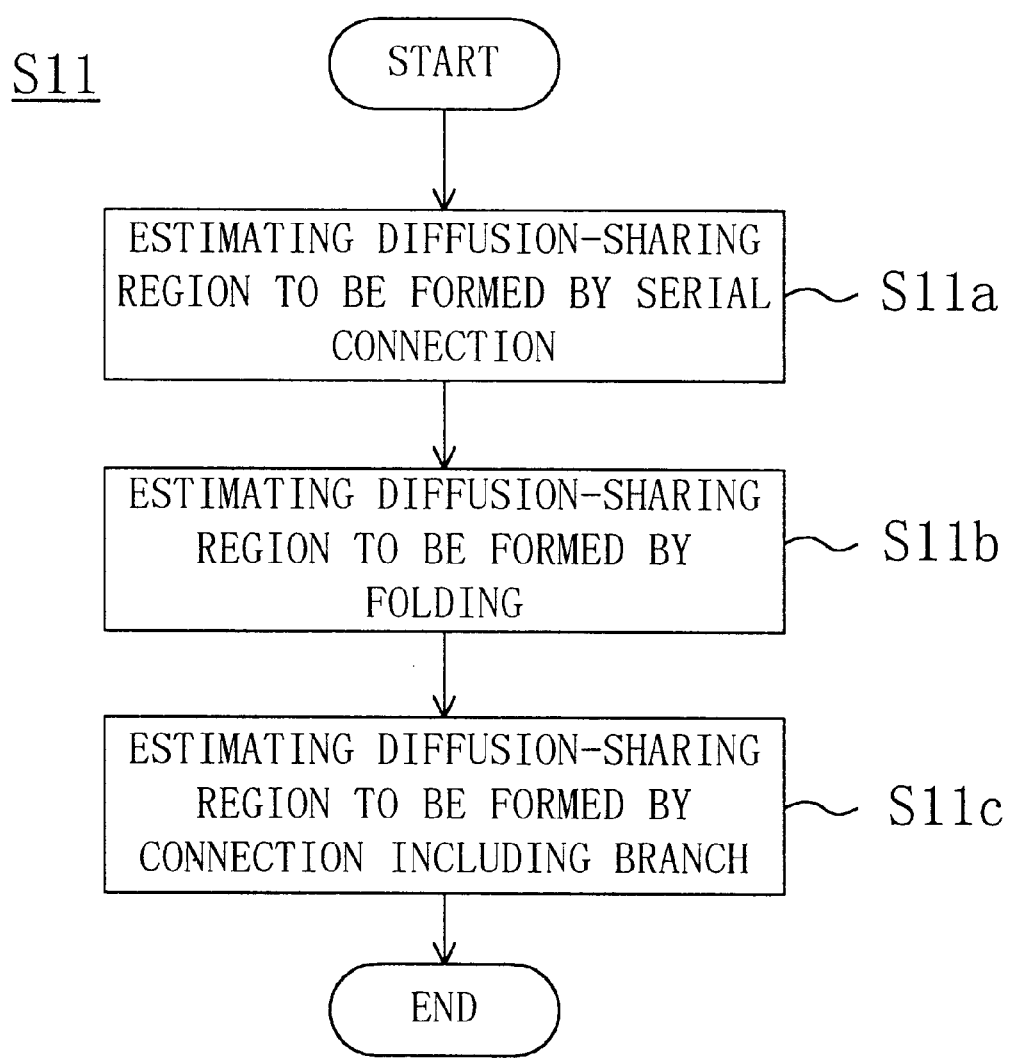
FIG. 7 is a flow chart showing a process flow in the diffusion sharing estimation step of the transistor size determining method shown in FIG. 6.

FIG. 7 is a flow chart showing a process flow in the diffusion sharing estimation step S11. In FIG. 7, S11a is a step of estimating a diffusion-sharing region to be formed by a serial connection, S11b is a step of estimating a diffusion-sharing region to be formed by folding, and S11c is a step of estimating a diffusion-sharing region to be formed by a connection including a branch.

For example, in the circuit represented by the circuit data in FIG. 3, the diffusion sharing is estimated to exist in the following regions.

(1) A Region Where the Transistors tr3 and tr4 are Serially Connected to Each Other Considering the circuit connection information, it can be seen that the source of the transistor tr3 is connected to the drain of the transistor tr4 and a net connecting the source of the transistor tr3 to the drain of the transistor tr4 is not connected to any other transistor or terminal. In such a case, a layout in which the source of the transistor tr3 and the drain of the transistor tr4 share a common diffusion region without using a contact can be employed, and the probability that diffusion sharing is implemented without using a contact in an actual layout is very high. Thus, in Step S11a, the connection between the source of the transistor tr3 and the drain of the transistor tr4 is estimated to be a diffusion-sharing region to be formed by a serial connection.

(2) A Region Where the Drains of the Transistors tr1 and tr2 are Connected to Each Other Considering the circuit connection information, it can be seen that the drain of the transistor tr1 is connected to the drain of the transistor tr2 and the net connecting the drains of the transistors tr1 and tr2 is connected to an n-type transistor or a terminal but is not connected to the drain or the source of any other p-type transistor. In such a case, a layout in which the drains of the transistors tr1 and tr2 share a common diffusion region while using a contact can be employed, and the probability that diffusion sharing is implemented while using a contact in an actual layout is very high. Thus, in Step S11c, the connection between the drains of the transistors tr1 and tr2 is estimated to be a diffusion-sharing region to be formed by a connection including a branch.

Figure 8:
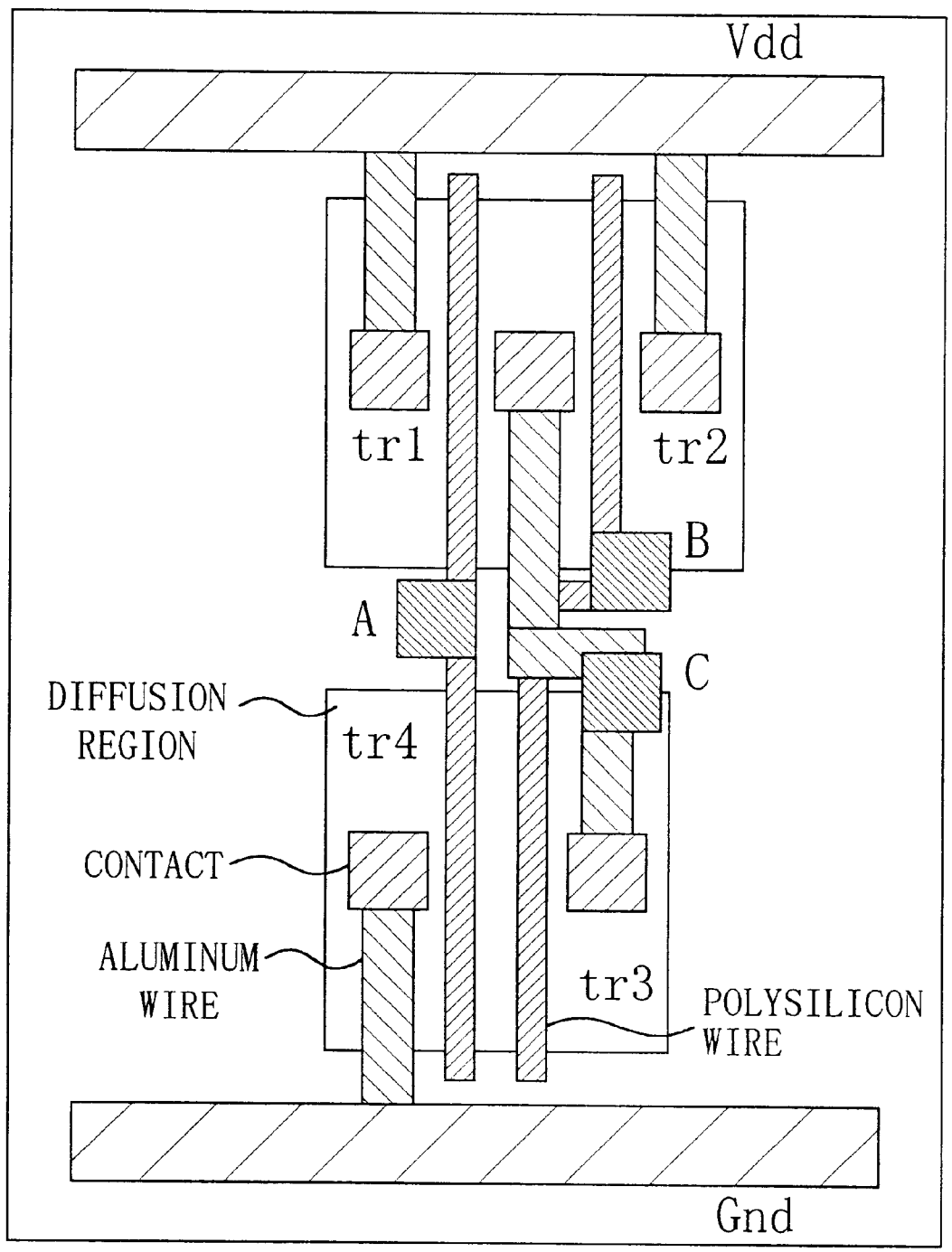
FIG. 8 is a plan view showing an exemplary circuit layout represented by the circuit data shown in FIG. 3.

FIG. 8 is a plan view showing a layout example of the circuit shown in FIG. 3. In FIG. 8, the transistors tr3 and tr4 involve diffusion sharing without using a contact, while the transistors tr1 and tr2 involve diffusion sharing using a contact.

Figure 9:
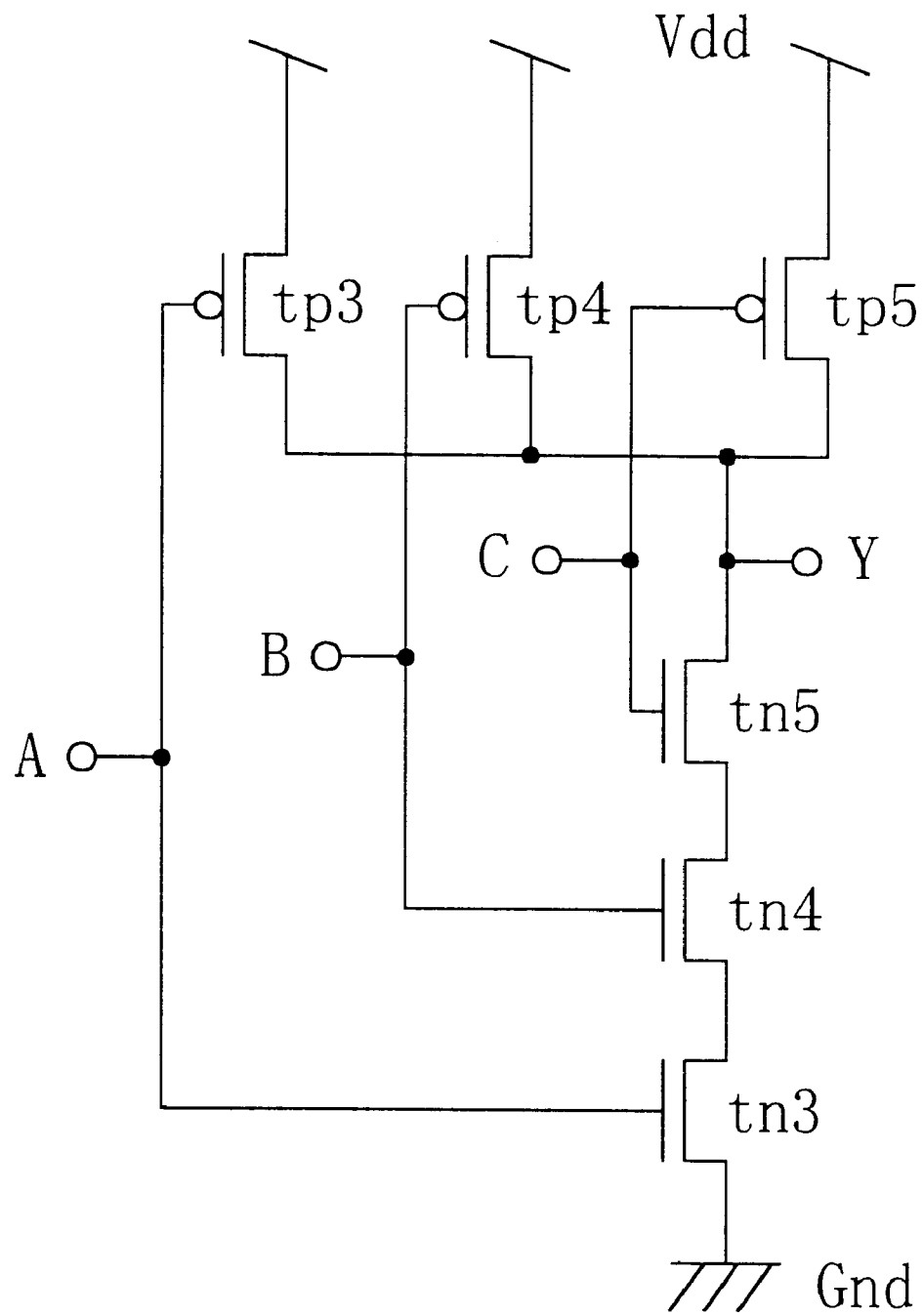
FIG. 9 is a circuit diagram showing another exemplary circuit data including a NAND function.

FIG. 9 shows another exemplary circuit data for a circuit having a NAND function. In FIG. 9, tp3, tp4 and tp5 denote p-type transistors, tn3, tn4 and tn5 denote n-type transistors, A, B and C denote input terminals and Y denotes an output terminal. In FIG. 9, the diffusion sharing is estimated to exist in the following regions.

(1) A Region Where the Transistors tp3, tp4 and tp5 are Connected to Each Other via a Branch Considering the circuit connection information, it can be seen that the drains of the transistors tp3, tp4 and tp5 are connected to each other. In such a case, a layout in which two of the drains of the transistors tp3, tp4 and tp5 involve diffusion sharing using a contact can be employed, and the probability that diffusion sharing is implemented between two of the drains of the transistors tp3, tp4 and tp5 while using a contact in an actual layout is very high. Thus, in Step S11c, two arbitrary transistors are selected from the transistors tp3, tp4 and tp5, the connection between the drains of the two selected transistors is estimated to be a diffusion-sharing region to be formed by a connection including a branch. It is noted that even when diffusion sharing is implemented between the drains of the transistors, which are not selected herein, in an actual layout, no significant error is caused in estimating the area of a diffusion region.

Moreover, the pair of diffusion regions where diffusion sharing is estimatingly implemented may be determined in accordance with the sizes of the transistors in the descending order, for example. This is because the larger the size of a transistor is, the more effective the diffusion sharing is.

(2) A Region Where the Transistors tn3, tn4 and tn5 are Serially Connected to Each Other In the same way as the transistors tr3 and tr4 shown in FIG. 3, the transistors tn3 and tn4 are serially connected to the transistors tn4 and tn5, respectively. Thus, it is estimated that diffusion sharing is implemented without using a contact in the connection between the transistors tn3 and tn4 and in the connection between the transistors tn4 and tn5. Thus, in Step S11a, the connection between the transistors tn3 and tn4 and the connection between the transistors tn4 and tn5 are estimated to be diffusion-sharing regions to be formed by a serial connection.

(3) Regions Where the Transistors tn3, tn4 and tn5 are Folded

For example, the transistor sizes of the transistors tn3, tn4 and tn5 are assumed to be set at an equal value of 80, whereas the height of the region (N well), in which the n-type transistors are arranged, is assumed to be 50. When the transistor size is larger than the height of the well as in this case, the transistors are estimated to be folded in Step 11b.

Figure 10:
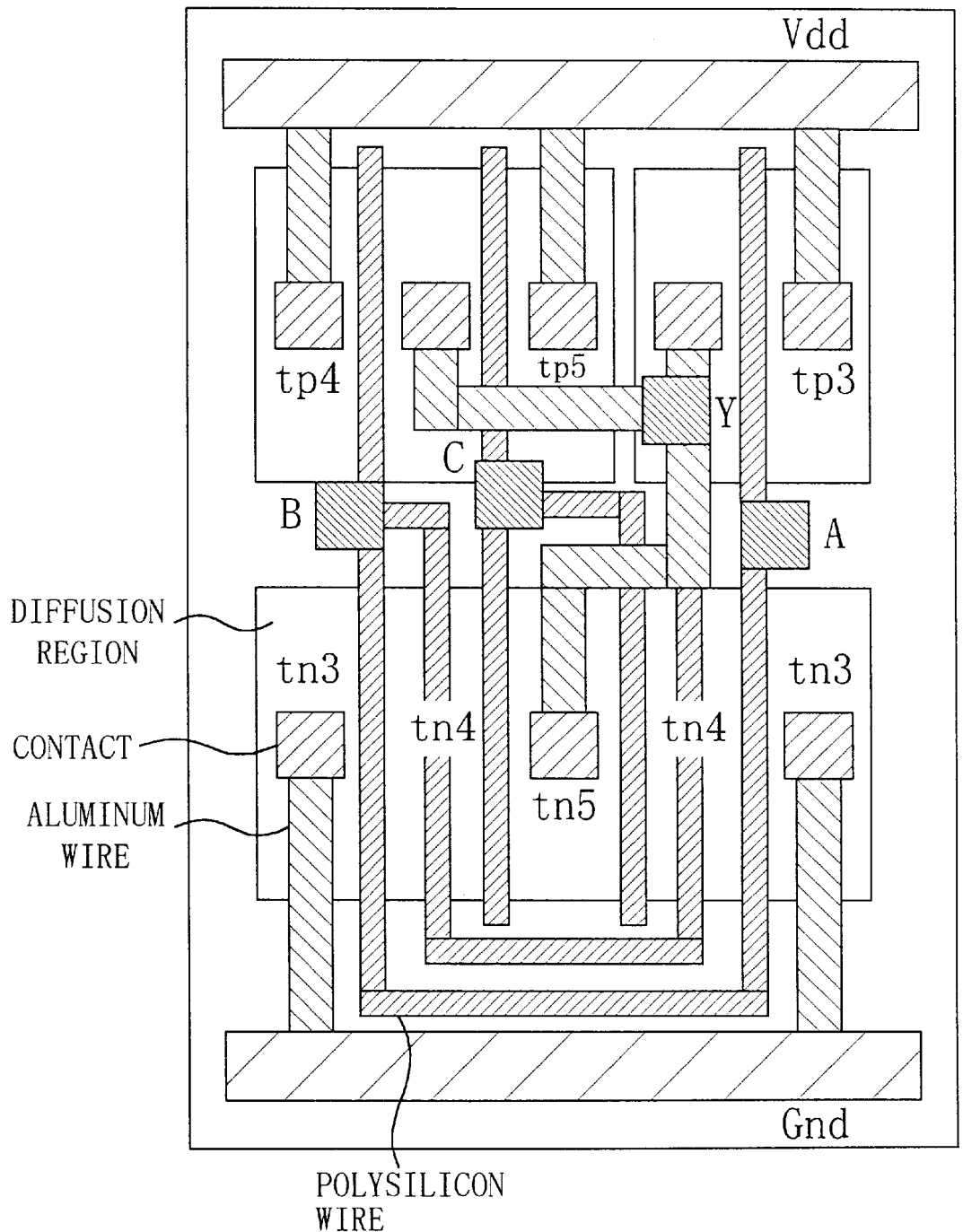
FIG. 10 is a plan view showing an exemplary circuit layout represented by the circuit data shown in FIG. 9.

FIG. 10 is an exemplary layout for the circuit shown in FIG. 9. In FIG. 10, the transistors tn3, tn4 and tn5 involve diffusion sharing not using a contact, the transistors tp3, tp4 and tp5 involve diffusion sharing using a contact and the transistors tn3, tn4 and tn5 are folded.

FIG. 11 is a table showing exemplary initial values of the transistor size candidates to be set in Step S10 for the circuit data shown in FIG. 3. As shown in FIG. 11, the size of the transistors tr1, tr3 and tr4 shown in FIG. 3 is 3.0 and the size of the transistor tr2 is 5.0.

In this case, since the size of the transistor tr2 is 5.0, which is longer than the height Hp (=4.8) of the p well shown in FIG. 4, it is expected that the transistor tr2 is folded twofold, i.e., the number of the folded sections of the transistor tr2 is two. On the other hand, since the transistors tr3 and tr4 are serially connected to each other and no branch exists from the connection node therebetween, it is expected that the area and the diffusion capacitance thereof can be considerably reduced by implementing diffusion sharing between these transistors. Thus, the diffusion sharing estimation section 11 outputs the information about the number of transistor folded sections such as that shown in FIG. 12 and the information about the diffusion sharing implemented by connection such as that shown in FIG. 13.

The information about the number of transistor folded sections shown in FIG. 12 indicates that the transistor tr2 is folded twofold and that the transistors tr1, tr3 and tr4 are not folded. On the other hand, the information about the diffusion sharing implemented by connection indicates the names of two transistors, between which diffusion sharing is implemented and also indicates whether the source (S) or the drain (D) of each of these transistors is included in the diffusion-sharing region. Thus, the information shown in FIG. 13 indicates that diffusion sharing is estimatingly implemented between the source of the transistor tr3 and the drain of the transistor tr4.

Area Estimation

Next, in Step S12, the estimated area calculation section 12a calculates an estimated area of the integrated circuit based on the transistor size information such as that shown in FIG. 11, the information about the number of transistor folded sections such as that shown in FIG. 12 and the information about the diffusion sharing implemented by connection such as that shown in FIG. 13.

Figure 14:
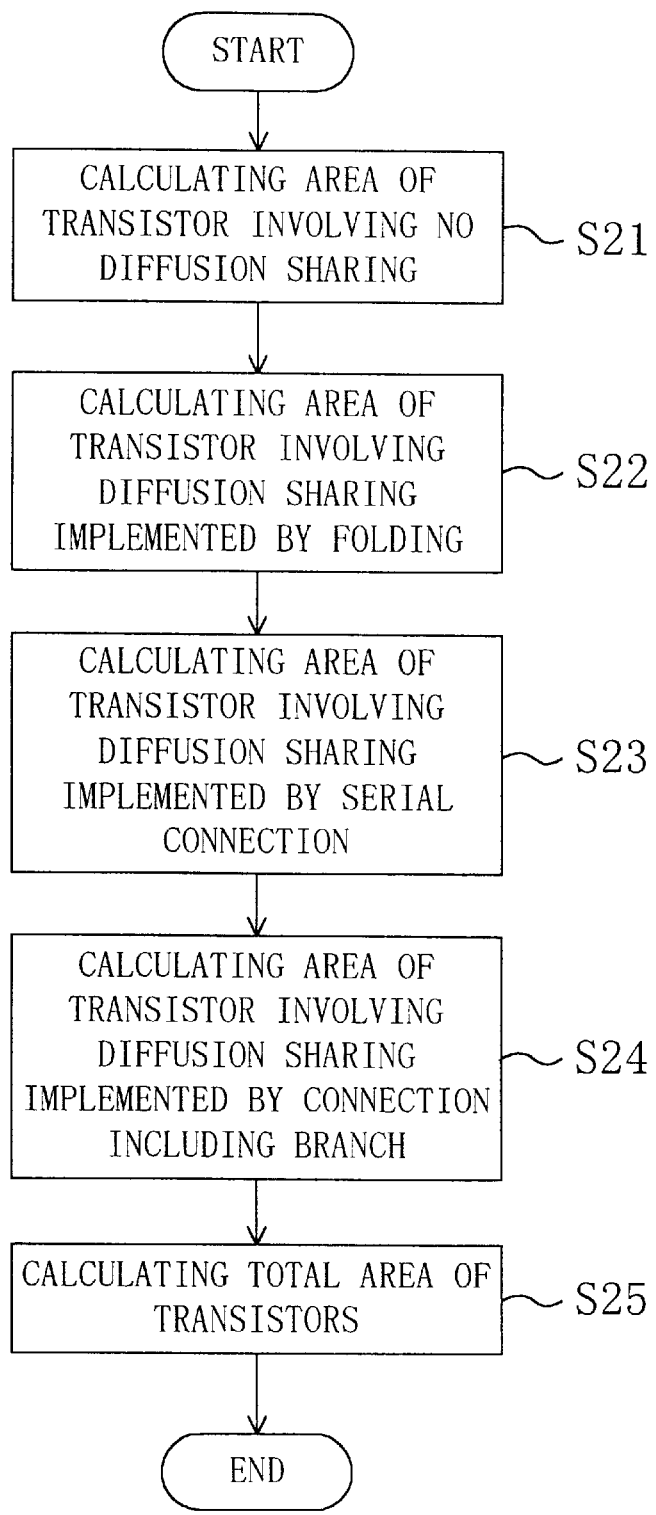
FIG. 14 is a flow chart showing a method for calculating an estimated area of an integrated circuit in an embodiment of the present invention.

FIG. 14 is a flow chart showing a process flow in Step S12, i.e., a method for calculating an estimated area of the integrated circuit in this embodiment. In FIG. 14, S21 is a step of calculating an area of a transistor involving no diffusion sharing, S22 is a step of calculating an area of a transistor involving diffusion sharing implemented by the folding of a transistor, S23 is a step of calculating an area of a transistor involving diffusion sharing implemented by a serial connection, S24 is a step of calculating an area of a transistor involving diffusion sharing implemented by a connection including a branch, and S25 is a step of calculating a total area of the transistors.

The area occupied by the integrated circuit can be approximated as a sum of the total area of the transistors and the total area of the wires. In this case, assuming the total area of the wires to be substantially constant, the area of the entire circuit can be evaluated by the total sum of the areas of the transistors. Thus, in this embodiment, assuming that the areas of the transistors tr1 to tr4 as represented by the circuit data shown in FIG. 3 are denoted by A1 to A4, respectively, the total area A of the transistors given by:

$$A = A1 + A2 + A3 + A4 \tag{1}$$

is regarded as the area of the circuit, thereby evaluating the integrated circuit.

Assuming the gate width of a transistor i to be denoted by Wi, the area Ai of the transistor i, involving no diffusion sharing, can be calculated based on the following equation.

$$Ai = Lt \times Wi \tag{2}$$

On the other hand, the areas of the transistors, involving diffusion sharing, can be calculated based on the following equations for the diffusion sharing implemented by a serial connection, the diffusion sharing implemented by the folding of a transistor and the diffusion sharing implemented by a connection including a branch, respectively.

$$Ai = (Lt - S) \times Wi \tag{3}$$

$$Ai = (Lt - F) \times Wi \tag{4}$$

$$Ai = (Lt - P) \times Wi \tag{5}$$

First, in Step S21, the area of the transistor involving no diffusion sharing, i.e., the area of the transistor tr1, is calculated. By applying Equation (2), the area A1 of the transistor tr1 can be obtained as:

$$A1 = Lt \times W = 1.3 \times 3.0 = 3.9$$

Next, in Step S22, the area of the transistor involving diffusion sharing implemented by folding, i.e., the area of the transistor tr2, in which twofold folding is estimatingly implemented, is calculated. By applying Equation (4), the area A2 of the transistor tr2 can be obtained as:

$$A2=(Lt-F)\times W2=(1.3-0.3)\times 5.0=5.0$$

Next, in Step S23, the areas of the transistors involving diffusion sharing implemented by a serial connection, i.e., the areas of the transistors tr3 and tr4, are calculated. By applying Equation (3), the respective areas A3 and A4 of the transistors tr3 and tr4 can be obtained as:

$$A3=(Lt-S)\times W3=(1.3-0.4)\times 3.0=2.7$$

$$A4=(Lt-S)\times W4=(1.3-0.4)\times 3.0=2.7$$

In Step S24, the areas of the transistors involving diffusion sharing implemented by a connection including a branch are to be calculated. However, in this embodiment, there are no transistors involving diffusion sharing implemented by a connection including a branch in accordance with the information about the diffusion sharing implemented by a connection shown in FIG. 13. Thus, this step is skipped to proceed to the next step.

Finally, in Step S25, the total area of the transistors is calculated. By applying Equation (1), the total area A of the transistors can be obtained as:

$$A=A1+A2+A3+A4=3.9+5.0+2.7+2.7=14.3$$

FIG. 15 is a table showing the area calculation results obtained by performing the above-described calculations.

The estimated area calculation method of this embodiment is characterized in that an area can be calculated precisely in view of the decrease in diffusion capacitance resulting from the diffusion sharing. If the total area A of the transistors is calculated without taking the diffusion sharing into any consideration, then the result is:

$$A=1.3\times(3.0+5.0+3.0+3.0)=18.2$$

Thus, in such a case, the resulting area is overestimated by about 30% as compared with the case of taking the diffusion sharing into consideration as is done in this embodiment.

Delay Estimation

Next, in Step S13, the estimated delay calculation section 12b calculates an estimated delay of the integrated circuit based on the transistor size information such as that shown in FIG. 11, the information about the number of transistor folded sections such as that shown in FIG. 12 and the information about the diffusion sharing implemented by connection such as that shown In FIG. 13.

Figure 16:
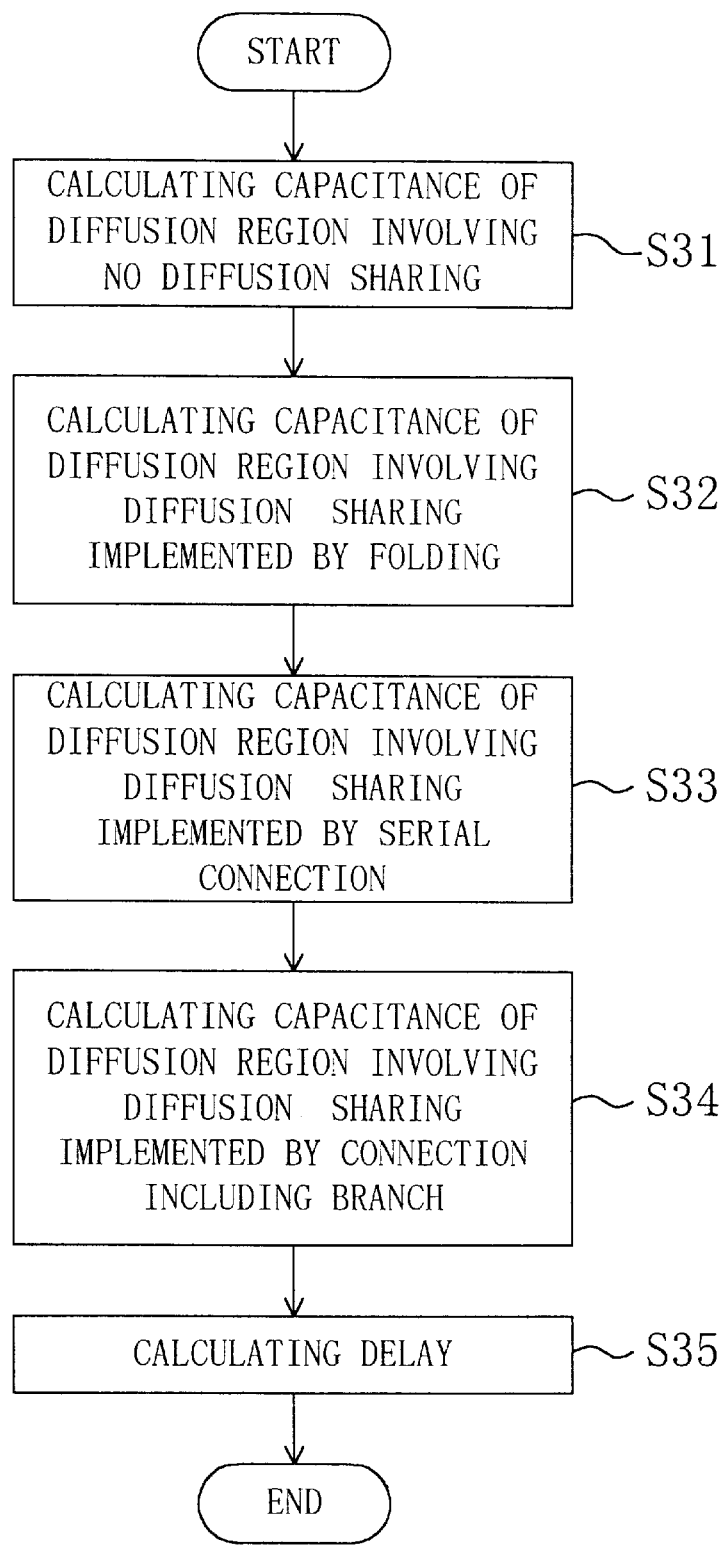
FIG. 16 is a flow chart showing a method for calculating an estimated delay of an integrated circuit in an embodiment of the present invention.

FIG. 16 is a flow chart showing a process flow in Step S13, i.e., a method for calculating an estimated delay of the integrated circuit in this embodiment. In FIG. 16, S31 is a step of calculating the capacitance of a diffusion region involving no diffusion sharing, S32 is a step of calculating the capacitance of a diffusion region involving diffusion sharing implemented by the folding of a transistor, S33 is a step of calculating the capacitance of a diffusion region involving diffusion sharing implemented by the serial connection of transistors, S34 is a step of calculating the capacitance of a diffusion region involving diffusion sharing implemented by the connection of transistors via a branch, and S35 is a step of calculating delays.

In the circuit data shown in FIG. 3, the delays to be calculated are defined as follows.

$Da/f$: from the inputs $(A, B)$=(rise, 1) to the output C=fall $Db/f$: from the inputs $(A, B)$=(1, rise) to the output C=fall $Da/r$: from the inputs $(A, B)$=(fall, 1) to the output C=rise $Db/r$: from the inputs $(A, B)$=(1, fall) to the output C=rise The delay of the circuit can be approximated as a total sum of resistance-capacitance (RC) products. Assuming that the output capacitance is zero, the drivability of the input is ∞ and both the wiring capacitance and the wiring resistance are negligible for the sake of simplicity, then the respective delays can be represented as:

$$Da/f=R4\times(C3s+C4d)+(R4+R3)\times(C1d+C2d+C3d)$$

$$Db/f=(R4+R3)\times(C1+C2d+C3d)$$

$$Da/r=R1\times(C1d+C2d+C3d)$$

$$Db/r=R2\times(C1d+C2d+C3d)$$

where C3s denotes the source capacitance value of the transistor tr3; C1d, C2d, C3d and C4d denote drain capacitance of the transistors tr1, tr2, tr3 and tr4, respectively; and R1, R2, R3 and R4 denote gate resistance of the transistors tr1, tr2, tr3 and tr4, respectively.

First, in Step S31, the capacitance of the diffusion regions involving no diffusion sharing, i.e., the drain capacitance of the transistors tr1 and tr3 is calculated. Since the diffusion capacitance C0 per unit area is 1.0 as represented by the technology data shown in FIG. 4, the drain capacitance C1d and C3d of the transistors tr1 and tr3 is:

$$C1d=C0\times Ld\times W1=1.0\times 0.6\times 3.0=1.8$$

$$C3d=C0\times Ld\times W3=1.0\times 0.6\times 3.0=1.8$$

Next, in Step S32, the capacitance of a diffusion region involving diffusion sharing implemented by the folding of a transistor, i.e., the drain capacitance of the transistor tr2, is calculated. The drain capacitance C2d of the transistor tr2 is:

$$C2d=C0\times(Ld-F)\times W2=1.0\times(0.6-0.3)\times 5.0=1.5$$

Next, in Step S33, the capacitance of the diffusion regions involving diffusion sharing implemented by the serial connection of transistors, i.e., the source capacitance of the transistor tr3 and the drain capacitance of the transistor tr4, are calculated. The source capacitance C3s of the transistor tr3 and the drain capacitance C4d of the transistor tr4 are:

$$C4d=C0\times(Ld-S)\times W4=1.0\times(0.6-0.4)\times 3.0=0.6$$

$$C3s=C0\times(Ld-S)\times W3=1.0\times(0.6-0.4)\times 3.0=0.6$$

In Step S34, the capacitance of the diffusion region involving diffusion sharing implemented by the connection of transistors via a branch is to be calculated. However, in this embodiment, since there are no transistors involving diffusion sharing implemented by a connection including a branch in accordance with the information about the diffusion sharing shown in FIG. 13, this step is skipped to proceed to the next step.

Finally, in Step S35, the delays of the circuit are calculated. Since the gate resistance R0 per unit length is 30 as represented by the technology data in FIG. 4, the gate resistance R1 to R4 is given as:

$$R1=R0/W1=30/3.0=10$$

$$R2=R0/W2=30/5.0=6$$

$$R3=R0/W3=30/3.0=10$$

$$R4=R0/W4=30/3.0=10$$

Thus, the circuit delays can be calculated as:

$$Da/f = 10 \times (0.6 + 0.6) + (10 + 10) \times (1.8 + 1.5 + 1.8)$$
$$= 114$$
$$Db/f = (10 + 10) \times (1.8 + 1.5 + 1.8) = 102$$
$$Da/r = 10 \times (1.8 + 1.5 + 1.8) = 51$$
$$Db/r = 6 \times (1.8 + 1.5 + 1.8) = 30.6$$

FIG. 17 is a table showing the delay calculation results obtained by performing the above-described calculations. As shown in FIG. 17, the delay value on the critical path is 114.

The estimated delay calculation method in this embodiment is characterized in that a delay can be calculated precisely in view of the decrement of the diffusion capacitance resulting from the diffusion sharing.

If the calculations are performed without taking the diffusion sharing into any consideration, the drain capacitance C2d of the transistor tr2, the drain capacitance C4d of the transistor tr4 and the source capacitance C3s of the transistor tr3 are:

$$C2d = C0 \times Ld \times W2 = 1.0 \times 0.6 \times 5.0 = 3.0$$
$$C4d = C0 \times Ld \times W4 = 1.0 \times 0.6 \times 3.0 = 1.8$$
$$C3s = C0 \times Ld \times W3 = 1.0 \times 0.6 \times 3.0 = 1.8$$

Thus, the respective delays are calculated as:

$$Da/f = 10 \times (1.8 + 1.8) + (10 + 10) \times (1.8 + 3.0 + 1.8)$$
$$= 168$$
$$Db/f = (10 + 10) \times (1.8 + 3.0 + 1.8) = 132$$
$$Da/r = 10 \times (1.8 + 3.0 + 1.8) = 66$$
$$Db/r = 6 \times (1.8 + 3.0 + 1.8) = 39.6$$

Consequently, the delays are overestimated by about 30% to about 50%, as compared with the case of taking the diffusion sharing into consideration as is done in this embodiment.

Consumed Power Estimation

Next, in Step S14, the estimated consumed power calculation section 12c calculates estimated power consumed by the entire circuit.

Figure 18:
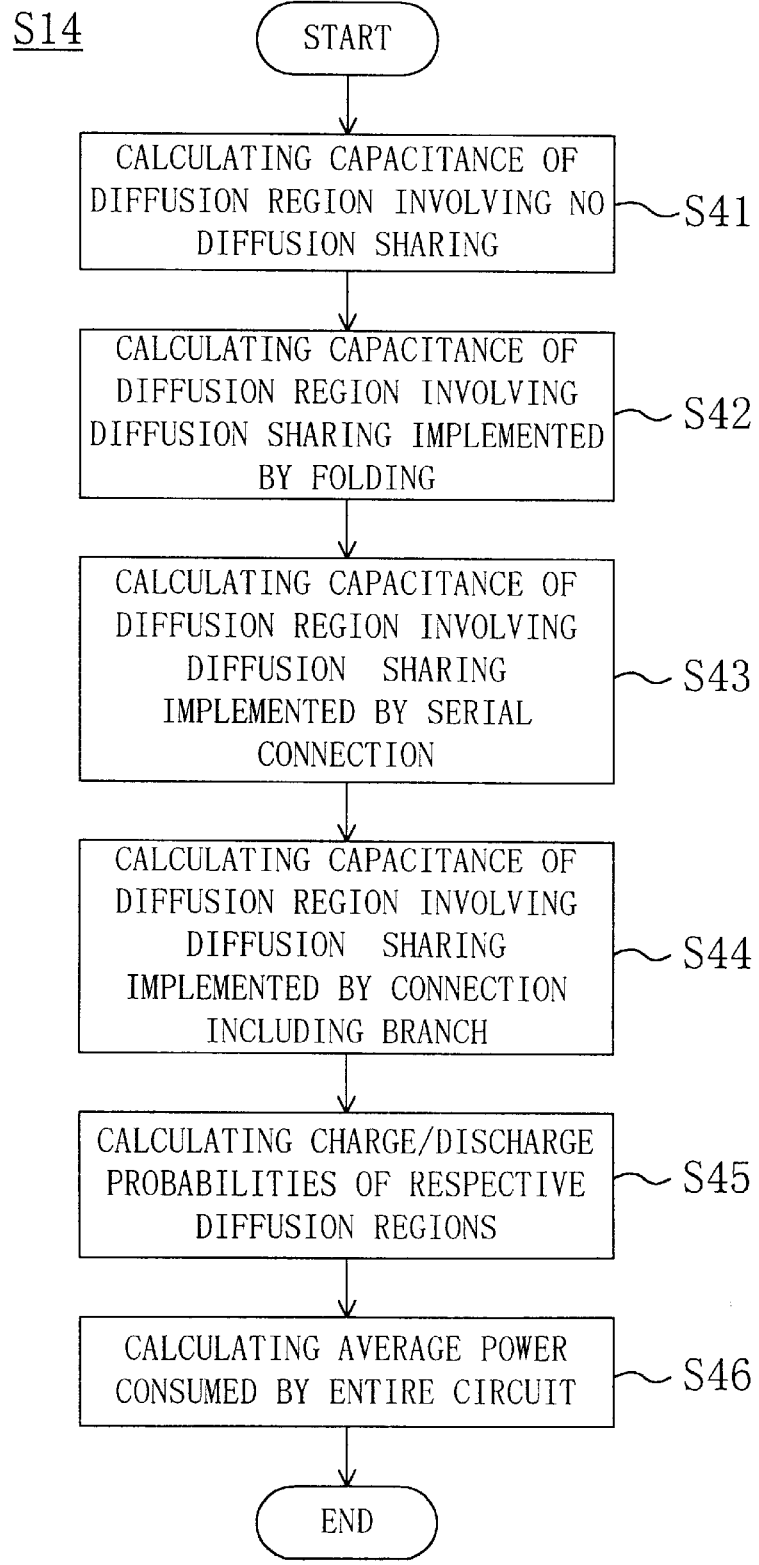
FIG. 18 is a flow chart showing a method for calculating estimated power consumed by an integrated circuit in an embodiment of the present invention.

FIG. 18 is a flow chart showing a process flow in Step S14, i.e., a method for calculating estimated power consumed by the integrated circuit in this embodiment. In FIG. 18, S41 is a step of calculating the capacitance of a diffusion region involving no diffusion sharing, S42 is a step of calculating the capacitance of a diffusion region involving diffusion sharing implemented by the folding of transistors, S43 is a step of calculating the capacitance of a diffusion region involving diffusion sharing implemented by a serial connection of transistors, S44 is a step of calculating the capacitance of a diffusion region involving diffusion sharing implemented by the connection of transistors via a branch, S45 is a step of calculating the charge/discharge probabilities of the respective diffusion regions and S46 is a step of calculating the average power consumed by the entire circuit. The same processes as those performed in Steps S31 to S34 for calculating an estimated delay as shown in FIG. 16 are performed in Steps S41 to S44. Specifically, the capacitance of the respective diffusion regions is calculated in Steps S41 to S44, the charge/discharge probabilities of the respective diffusion regions are calculated in Step S45 and then the average power consumed by the entire circuit is calculated in Step S46 by using the capacitance and the charge/discharge probabilities of the respective diffusion regions.

FIG. 6 will be referred to again. As shown in FIG. 6, an optimum transistor size and an optimum number of folded sections are next to be selected in Step S15. However, in this embodiment, only the initial values thereof have been evaluated. Thus, the procedure advances to Step S17 via Step S16, thereby making the transistor size optimization section 13 set substitutive transistor size candidates. In this embodiment, the transistor size candidates are to be set at random.

FIG. 19 is a table showing the information about newly set transistor size candidates. As shown in FIG. 19, the size candidates of the transistors tr1, tr2, tr3 and tr4 are 4.4, 4.5, 3.0 and 3.0, respectively.

Next, returning to Step S11, the diffusion sharing estimation section 11 estimates the number of transistor folded sections and the diffusion-sharing regions in the integrated circuit based on the transistor size candidates which have been set in Step S17.

In this case, since the size of each transistor is smaller than the height Hp of the p well (=4.8), it is estimated that there are no transistors to be folded. On the other hand, though the transistors tr1 and tr2 are not serially connected to each other, it is estimated that the area and the diffusion capacitance thereof can be reduced by implementing diffusion sharing therebetween, because there are no other pair of transistors, the drains of which can be connected to each other and in which diffusion sharing can be implemented. Thus, the diffusion sharing estimation section 11 outputs the information about the number of transistor folded sections such as that shown in FIG. 20 and the information about the diffusion sharing implemented by connection such as that shown in FIG. 21.

The information about the number of transistor folded sections shown in FIG. 20 indicates that none of the transistors tr1, tr2, tr3 and tr4 is folded. On the other hand, the information about the diffusion sharing implemented by connection indicates that diffusion sharing is estimatingly implemented between the source of the transistor tr3 and the drain of the transistor tr4 and between the drain of the transistor tr1 and the drain of the transistor tr2.

Next, in Step S12, the estimated area calculation section 12a calculates an estimated area of the integrated circuit based on the transistor size information such as that shown in FIG. 19, the information about the number of transistor folded sections such as that shown in FIG. 20 and the information about the diffusion sharing implemented by connection such as that shown in FIG. 21.

Since diffusion sharing is estimatingly implemented between the drains of the transistors tr1 and tr2, the respective areas A1 and A2 thereof can be calculated as follows based on Equation (5):

$$A1 = (Lt-P) \times W1 = (1.3-0.3) \times 4.4 = 4.4$$
$$A2 = (Lt-P) \times W2 = (1.3-0.3) \times 4.5 = 4.5$$

Since diffusion sharing is estimatingly implemented by a serial connection between the transistors tr3 and tr4, the respective areas A3 and A4 thereof can be calculated as follows based on Equation (3):

$$A3 = (Lt-S) \times W3 = (1.3-0.4) \times 3.0 = 2.7$$
$$A4 = (Lt-P) \times W4 = (1.3-0.4) \times 3.0 = 2.7$$

Thus, by applying Equation (1), the total area A of the transistors can be calculated as:

$$A = A1+A2+A3+A4 = 4.4+4.5+2.7+2.7 = 14.3$$

FIG. 22 is a table showing the area calculation results obtained by performing the above-described calculations.

Next, in Step S13, the estimated delay calculation section 12b calculates an estimated delay of the integrated circuit based on the transistor size information such as that shown in FIG. 19, the information about the number of transistor folded sections such as that shown in FIG. 20 and the information about the diffusion sharing implemented by connection such as that shown in FIG. 21.

Since the diffusion capacitance C0 per unit area is 1.0 as represented by the technology data shown in FIG. 4, the drain capacitance C3d of the transistor tr3 involving no the diffusion sharing is:

$$C3d = C0 \times Ld \times W3 = 1.0 \times 0.6 \times 3.0 = 1.8$$

Since diffusion sharing is estimatingly implemented between the drains of the transistors tr1 and tr2, the drain capacitance C1d and C2d of the transistors tr1 and tr2 are:

$$C1d = C0 \times (Ld-P) \times W1 = 1.0 \times (0.6-0.3) \times 4.4 = 1.32$$

$$C2d = C0 \times (Ld-P) \times W2 = 1.0 \times (0.6-0.3) \times 4.5 = 1.35$$

Since diffusion sharing is estimatingly implemented by a serial connection between the transistors tr3 and tr4, the source capacitance C3s of the transistor tr3 and drain capacitance C4d of the transistor tr4 are:

$$C4d = C0 \times (Ld-S) \times W4 = 1.0 \times (0.6-0.4) \times 4.4 = 0.6$$

$$C3s = C0 \times (Ld-S) \times W3 = 1.0 \times (0.6-0.4) \times 4.4 = 0.6$$

Since the gate resistance R0 per unit length is 30 as represented by the technology data in FIG. 4, the gate resistance R1 to R4 are given as:

$$R1 = R0/W1 = 30/4.4 = 6.82$$

$$R2 = R0/W2 = 30/4.5 = 6.67$$

$$R3 = R0/W3 = 30/3.0 = 10$$

$$R4 = R0/W4 = 30/3.0 = 10$$

Thus, the respective circuit delays can be calculated as:

$$Da/f = 10 \times (0.6 + 0.6) + (10 + 10) \times (1.32 + 1.35 + 1.8)$$
$$= 101.4$$
$$Db/f = (10 + 10) \times (1.32 + 1.35 + 1.8) = 89.4$$
$$Da/r = 6.82 \times (1.32 + 1.35 + 1.8) = 30.5$$
$$Db/r = 6.67 \times (1.32 + 1.35 + 1.8) = 29.8$$

FIG. 23 is a table showing the delay calculation results obtained by performing the above-described calculations. As shown in FIG. 23, the delay value on the critical path is 101.4.

Comparing the results shown in FIG. 17 with those shown in FIG. 23, it can be seen that the delay value on the critical path is smaller in FIG. 23 than that shown in FIG. 17. That is to say, considering the critical path only, the transistor size candidates shown in FIG. 19 can be regarded as being more appropriate for the integrated circuit shown in FIG. 3 than the transistor size candidates shown in FIG. 11. Thus, in Step S15, the transistor size candidates shown in FIG. 19 and the number of folded sections shown in FIG. 20 are selected as most appropriate solutions at that point in time.

By repeatedly performing similar processes, a more appropriate transistor size and a more appropriate number of folded sections can be obtained.

In this manner, an optimum size and an optimum number of folded sections are determined by the transistor size determination section 10 for each transistor in the integrated circuit, thereby producing the transistor size information 33 and the information about the number of folded sections 34.

The transistor size determining method of this embodiment is characterized in that the size and the number of folded sections of a transistor can be optimized with higher precision by evaluating the characteristics of an integrated circuit, i.e., by calculating an estimated area, an estimated delay and estimated consumed power of the integrated circuit while taking the diffusion sharing into consideration.

Next, the layout section 20 produces a layout 35 for the integrated circuit based on the transistor size information 33 and the information about the number of folded sections 34 which have been produced in the above-described manner. First, the arrangement determination section 21 determines the arrangement of the transistors, which may be performed in accordance with a method disclosed in Japanese Laid-Open Publication No. 9-298243 or the like. Next, the wiring determination section 22 determines the wiring among the transistors, which may be performed in accordance with a method disclosed in Japanese Laid-Open Publication No. 8-83302 or the like. Finally, the output section 23 produces and outputs the layout 35 based on the arrangement and wiring results.

Figure 24:
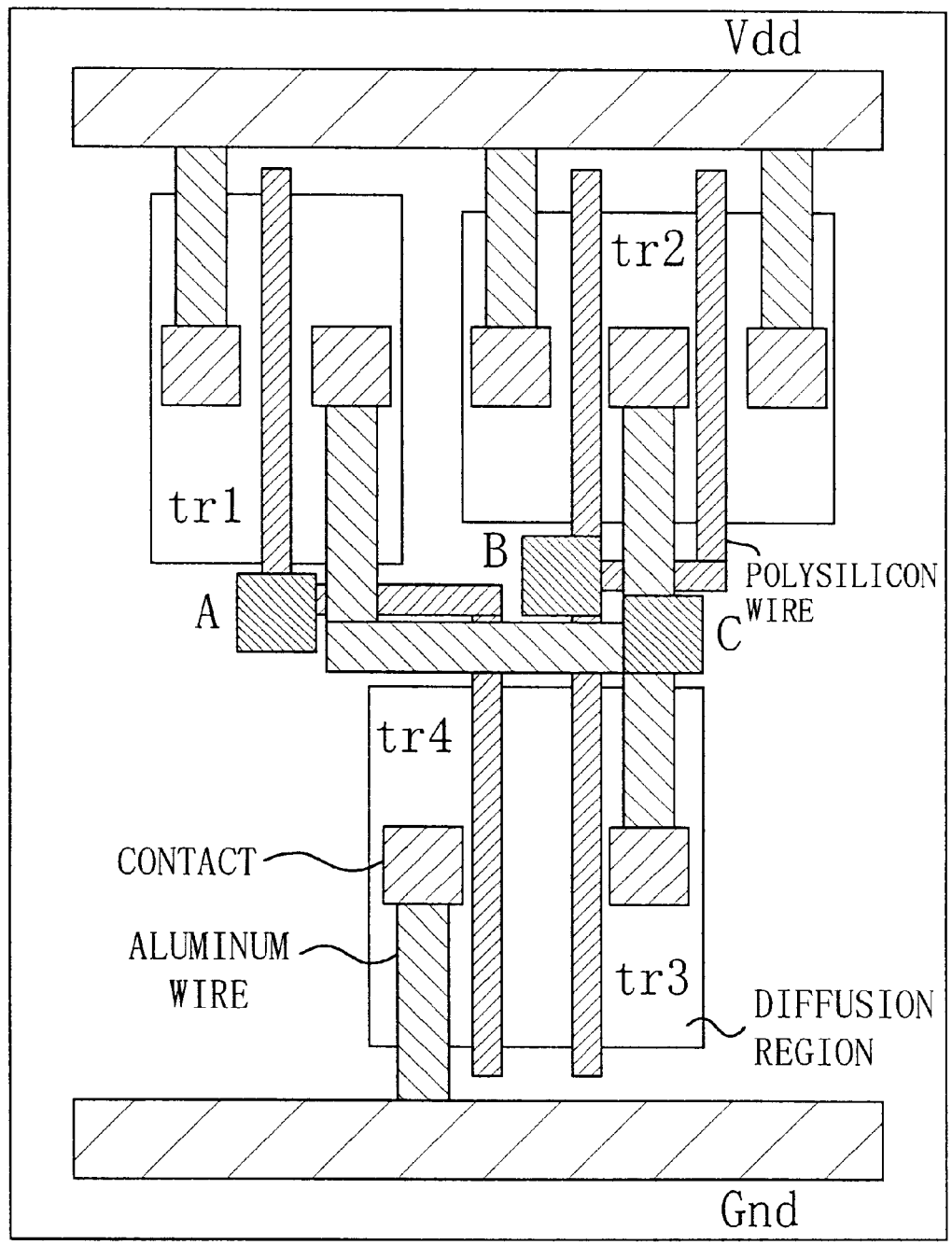
FIG. 24 is a plan view showing an exemplary layout produced by the layout section 20 and showing the results of a layout design performed based on the transistor size information shown in FIG. 11 and the information about the number of transistor folded sections shown in FIG. 12 for the circuit data shown in FIG. 3.

FIG. 24 is a plan view showing an exemplary layout produced by the layout section 20 and showing the results of the layout design performed for the circuit data shown in FIG. 3 based on the transistor size information shown in FIG. 11 and the information about the number of transistor folded sections shown in FIG. 12. In FIG. 24, tr1, tr2, tr3 and tr4 denote respective transistors, A and B denote input terminals and C denotes an output terminal.

As described above, since the layout designing apparatus for an integrated circuit according to this embodiment can optimize the size and the number of folded sections of a transistor before layout designing is performed, layout results, which result in various advantageous circuit characteristics such as area, delay performance and power consumption, can be produced in a short period of time.

Modified Example of Diffusion Sharing Estimation

In the diffusion sharing estimation step, when diffusion sharing implemented by a connection including a branch is estimated, the estimation may be performed while taking a probability of diffusion sharing into consideration.

First, the number of non-shared diffusion regions, in which neither diffusion sharing implemented by a serial connection nor diffusion sharing implemented by folding has been estimated to exist and in which diffusion sharing implemented by a connection including a branch can be implemented, is estimated. Since the diffusion sharing is implemented in the one-dimensional direction, the number of the diffusion-sharing regions neither become equal to nor exceed the number of diffusion islands, each of which is a collection of diffusion-sharing regions. Thus, in a net connecting a plurality of diffusion regions to each other, if the number of non-shared diffusion regions is assumed to be denoted by $\Sigma Nends$ and the number of diffusion islands, to which the non-shared diffusion regions belong, is assumed to be denoted by $\Sigma Ntr$, then the number Nshare of diffusion regions, in which diffusion sharing can be implemented, becomes the maximum even number satisfying the following inequalities.

$N\text{share} \leq \Sigma N\text{ends}$ $N\text{share} \leq \Sigma 2(\Sigma Ntr-1)$ Using the number Nshare of diffusion regions where diffusion sharing can be implemented, the probability Pshare that diffusion sharing occurs in the non-shared diffusion regions can be calculated by the following equation:

$P\text{share} = N\text{share}/\Sigma N\text{ends}$

In the case of using the probability Pshare for the evaluation functions for evaluating the characteristics of a circuit such as area and capacitance, an evaluation function Ec using the probability may be calculated by the following equation:

$Ec = Ea \cdot P\text{share} + Eb \cdot (1 - P\text{share})$

Where Ea denotes an evaluation function for the case where diffusion sharing occurs and Eb denotes an evaluation function for the case where diffusion sharing does not occur.

Figure 25A:
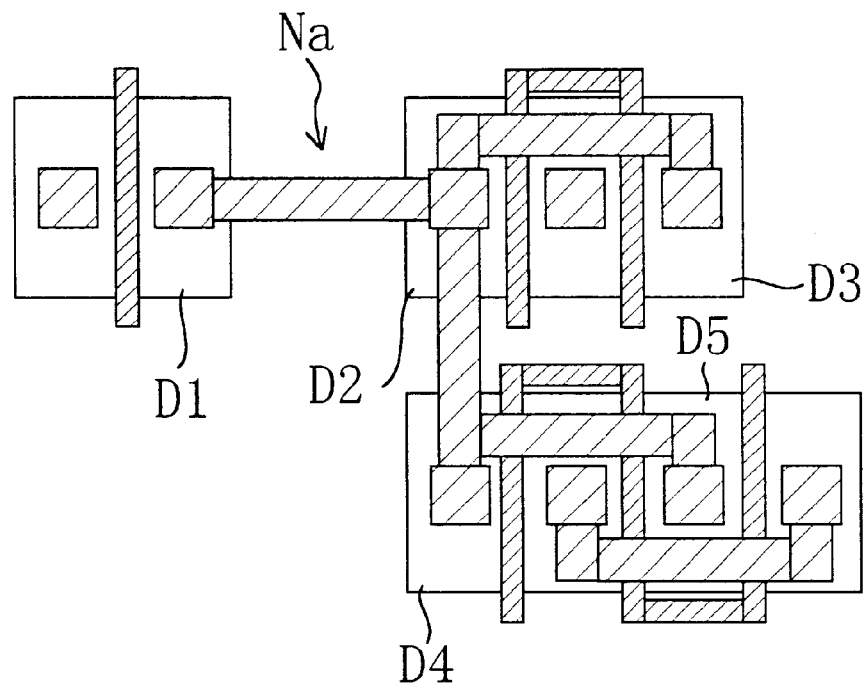
FIGS. 25A and 25B are plan views showing exemplary layouts having a branched connection for illustrating diffusion sharing estimation in a modified example of the present invention.
Figure 25B:
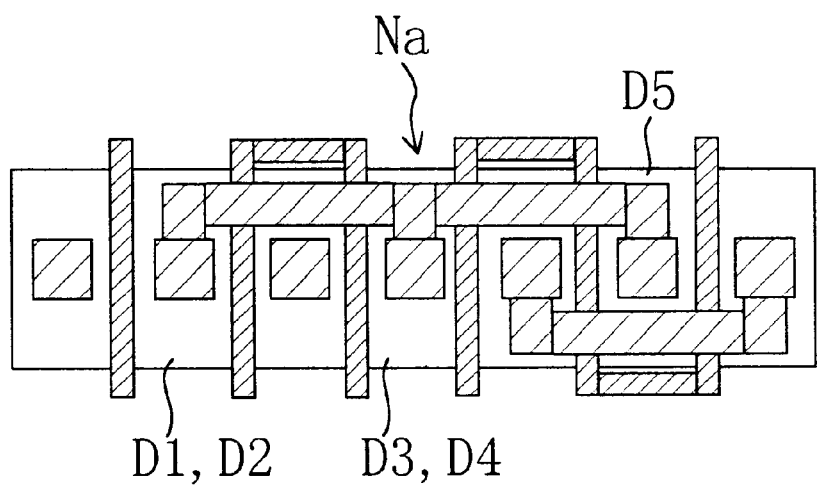

FIGS. 25A and 25B show exemplary layouts having a connection including a branch: FIG. 25A shows a layout before diffusion sharing is implemented; and FIG. 25B shows a layout after diffusion sharing has been implemented. In the net Na shown in FIG. 25A, diffusion sharing has already been implemented in a diffusion region D5 of the five diffusion regions D1 to D5, which are connected to each other. Thus, the number $\Sigma N\text{ends}$ of the non-shared diffusion regions is four. On the other hand, since the number $\Sigma Ntr$ of diffusion islands is three, $N\text{share} \leq \Sigma N\text{ends} = 4,$ and $N\text{share} \leq 2(\Sigma Ntr-1) = 2(3-1) = 4$ Thus, the maximum even number Nshare satisfying these inequalities is four. Consequently, in this case, the probability Pshare is given by the following equation:

$P\text{share} = N\text{share}/\Sigma N\text{ends} = 4/4 = 1$

That is to say, diffusion sharing is implemented in all of the non-shared diffusion regions D1 to D4 in the net Na. As a result of the diffusion sharing, the layout is turned into that shown in FIG. 25B, for example.

Figure 26A:
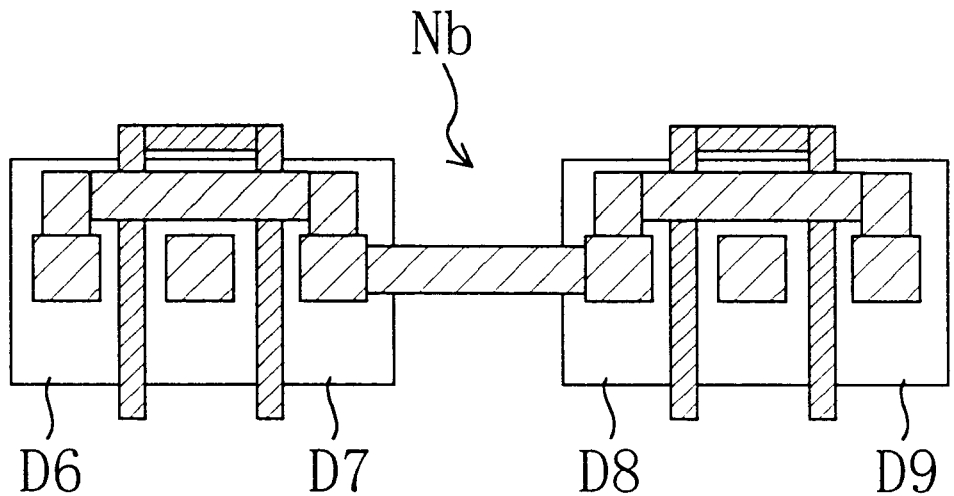
FIGS. 26A and 26B are plan views showing other exemplary layouts having a branched connection for illustrating diffusion sharing estimation in another modified example of the present invention.
Figure 26B:
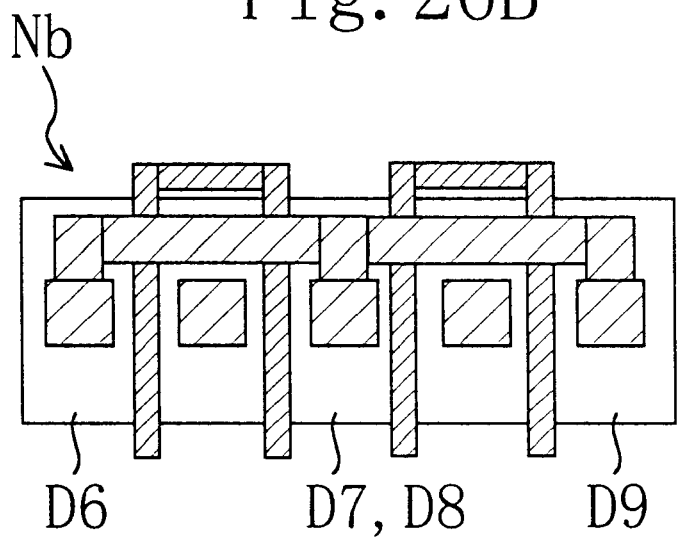

FIGS. 26A and 26B show other exemplary layouts having a connection including a branch: FIG. 26A shows a layout before diffusion sharing is implemented; and FIG. 26B shows a layout after diffusion sharing has been implemented. In the net Nb shown in FIG. 26A, diffusion sharing is not implemented in any of the four diffusion regions D6 to D9 which are connected to each other. Thus, the number $\Sigma N\text{ends}$ of non-shared diffusion regions is four. On the other hand, since the number $\Sigma Ntr$ of diffusion islands is two, $N\text{share} \leq \Sigma N\text{ends} = 4,$ and $N\text{share} \leq 2(\Sigma Ntr-1) = 2(2-1) = 2$ Thus, the maximum even number Nshare satisfying these inequalities is two. Consequently, in this case, the probability Pshare is given by the following equation:

$P\text{share} = N\text{share}/\Sigma N\text{ends} = 2/4 = 0.5$

That is to say, the probability that diffusion sharing occurs in each of the diffusion regions D6 to D9 in the net Nb is 0.5. As a result of diffusion sharing, the layout is turned into that shown in FIG. 26B, for example.

Modified Example of Area Estimation

In designing a layout for an integrated circuit, if the number of transistors included in the integrated circuit is sufficiently large and if the area where the transistors are arranged is also sufficiently large both vertically and horizontally, then the transistors may be two-dimensionally arranged in a free layout so as to fill in the space. On the other hand, if the height (or the vertical size) of the arrangement region is not so large as compared with the sizes of the transistors, then the transistors are arranged substantially one-dimensionally.

In this modified example, in view of the above-described points, the layout area of the integrated circuit is estimated by combining an area estimation model, in which the transistors are assumed to be arranged one-dimensionally, with an area estimation model, in which the transistors are assumed to be arranged two-dimensionally.

Figure 27:
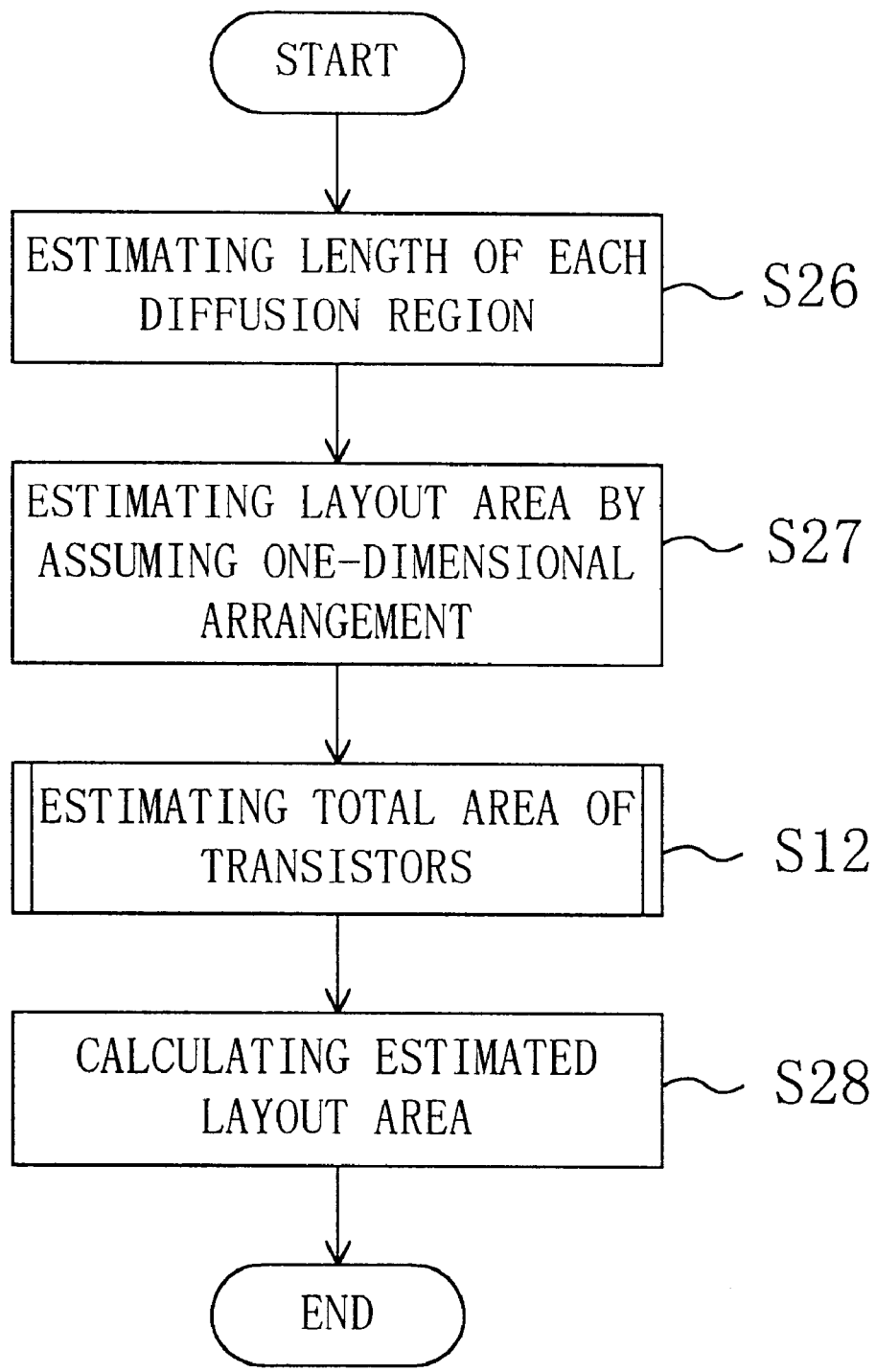
FIG. 27 is a flow chart showing a method for calculating an estimated area in a modified example of the present invention.

FIG. 27 is a flow chart showing the respective steps of the area estimation step in this modified example. In the area estimation step in the modified example shown in FIG. 27, Steps S26 and S27 are additionally performed prior to Step S12, which is the area estimation step in the above-described embodiment shown in FIG. 14, and Step S28 is further performed posterior to Step S12.

Figure 28:
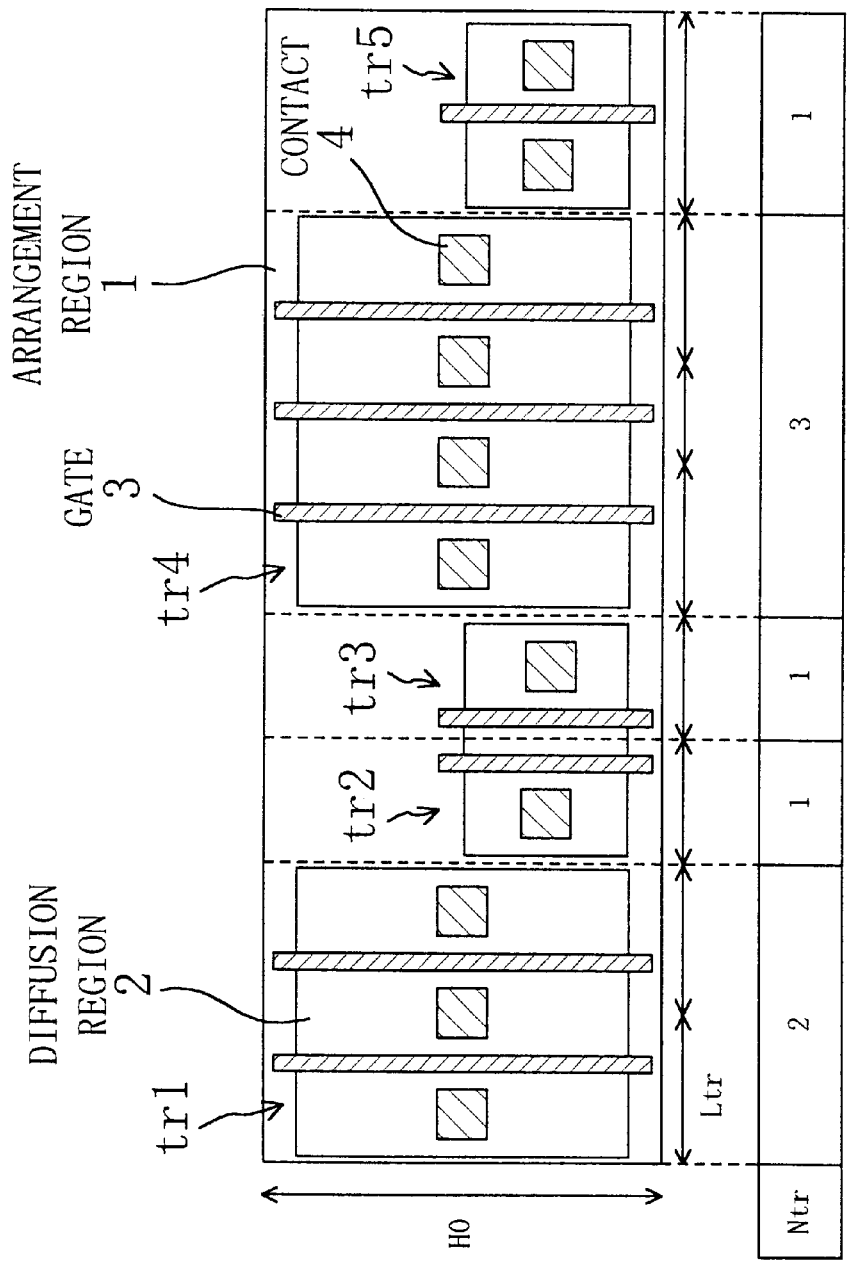
FIG. 28 is a plan view showing an area estimation model obtained by assuming a one-dimensional arrangement in the method for calculating an estimated area shown in FIG. 27.

FIG. 28 is a plan view showing an area estimation model of this modified example in which the transistors are arranged one-dimensionally. In FIG. 28, tr1 to tr5 denote transistors, 1 denotes an arrangement region, 2 denotes a diffusion region, 3 denotes the gate of a transistor and 4 denotes a contact. The transistor tr1 has been folded twofold to implement diffusion sharing, the transistor tr4 has been folded threefold to implement diffusion sharing, and the transistors tr2 and tr3 have been serially connected to each other to implement diffusion sharing. As shown in FIG. 28, if the height (or the vertical size) H0 of the arrangement region is not so large as compared with the sizes of the transistors, almost all of the transistors are arranged one-dimensionally. In an actual layout for an integrated circuit, the transistors are arranged in many cases as shown in FIG. 28.

In the area estimation model shown in FIG. 28, the layout area A1 (first layout area) of the integrated circuit is given by either one of the following equations:

$$A1 = H0 \cdot \Sigma Ltr \tag{11}$$

$$A1 = H0 \cdot \Sigma Ntr \tag{12}$$

where Ltr denotes the length of the diffusion region of each transistor and Ntr denotes the number of folded sections of each transistor. In FIG. 28, the number of folded sections Ntr and the length of the diffusion region Ltr are shown for each of the transistors tr1 to tr5.

In Equation (11), the product obtained by multiplying together the height H0 of the arrangement region and the total sum of the lengths Ltr of the diffusion regions, which have been calculated for the respective transistors, is estimated as the layout area A1. On the other hand, in Equation (12), the product obtained by multiplying together the height H0 of the arrangement region and the total sum of the numbers Ntr of folded sections, which have been calculated for the respective transistors, is estimated as the layout area A1.

In such an area estimation model, the layout area A1 is increased only when the transistors are folded. Thus, if the transistor sizes are optimized by using this model, then it is highly probable that a large number of transistors have the same size as the height H0 of the arrangement region. As a result, the gaps between the transistors, which are formed in designing a layout for an Integrated circuit, can be minimized.

In this modified example, the length of a diffusion region is estimated while taking diffusion sharing into consideration in Step S26. Next, in Step S27, the layout area is estimated on the assumption of a one-dimensional arrangement by using the lengths of the diffusion regions which have been obtained in Step S26.

On the other hand, in the model in which the transistors are assumed to be arranged two-dimensionally, the layout area A2 (second layout area) of the integrated circuit can be estimated as a total sum of the areas of the transistors and the areas of the wires. The total sum of the transistors can be obtained in Step S12 while taking diffusion sharing into consideration.

The following relationship is satisfied among the actual layout area A of an integrated circuit, the estimated area A1 thereof obtained by using the one-dimensional model and the estimated area A2 thereof obtained by using the two-dimensional model.

$$A2 \leq A \leq A1$$

That is to say, when the transistors can be arranged so as to fill in the gaps, the layout area A is equal to the area A2. On the other hand, when the transistors are arranged one-dimensionally while neglecting the gaps therebetween, the layout area A is equal to the area A1.

Thus, in this modified example, in order to reflect both the features of the one-dimensional arrangement and those of the two-dimensional arrangement on the estimation of the layout out area in Step S28, the layout area A is calculated by the following equation:

$$A=(1-\alpha)\cdot A1+\alpha\cdot A2 \text{(where } 0 \leq \alpha \leq 1)$$

where $\alpha$ is a parameter for setting to what degree the estimated area A1 obtained by the one-dimensional model and the estimated area A2 obtained by the two-dimensional model are reflected on the layout area A. Herein, an empirical value is used as the parameter. As a result, the actual layout area of an integrated circuit can be approximated more satisfactorily.

It is noted that, depending on the design conditions, the estimated area obtained by the one-dimensional model may be directly regarded as the layout area by performing Steps S26 and S27 only.

Modified Example of Transistor Size Optimization

In this embodiment, when the characteristics of a circuit are evaluated, the evaluation indices, such as delay, are sometimes varied discontinuously because it becomes necessary to fold transistors as the sizes of the transistors are changed. Thus, the relationship between a transistor size and an evaluation index is not always represented by a continuous function. That is why, in a conventional method in which each transistor size candidate is initially set at a minimum size and subsequently replaced by a larger-size candidate one after another, it is possible that a local solution is generated at a discontinuous point. Thus, an optimum transistor size cannot always be determined.

Figure 29:
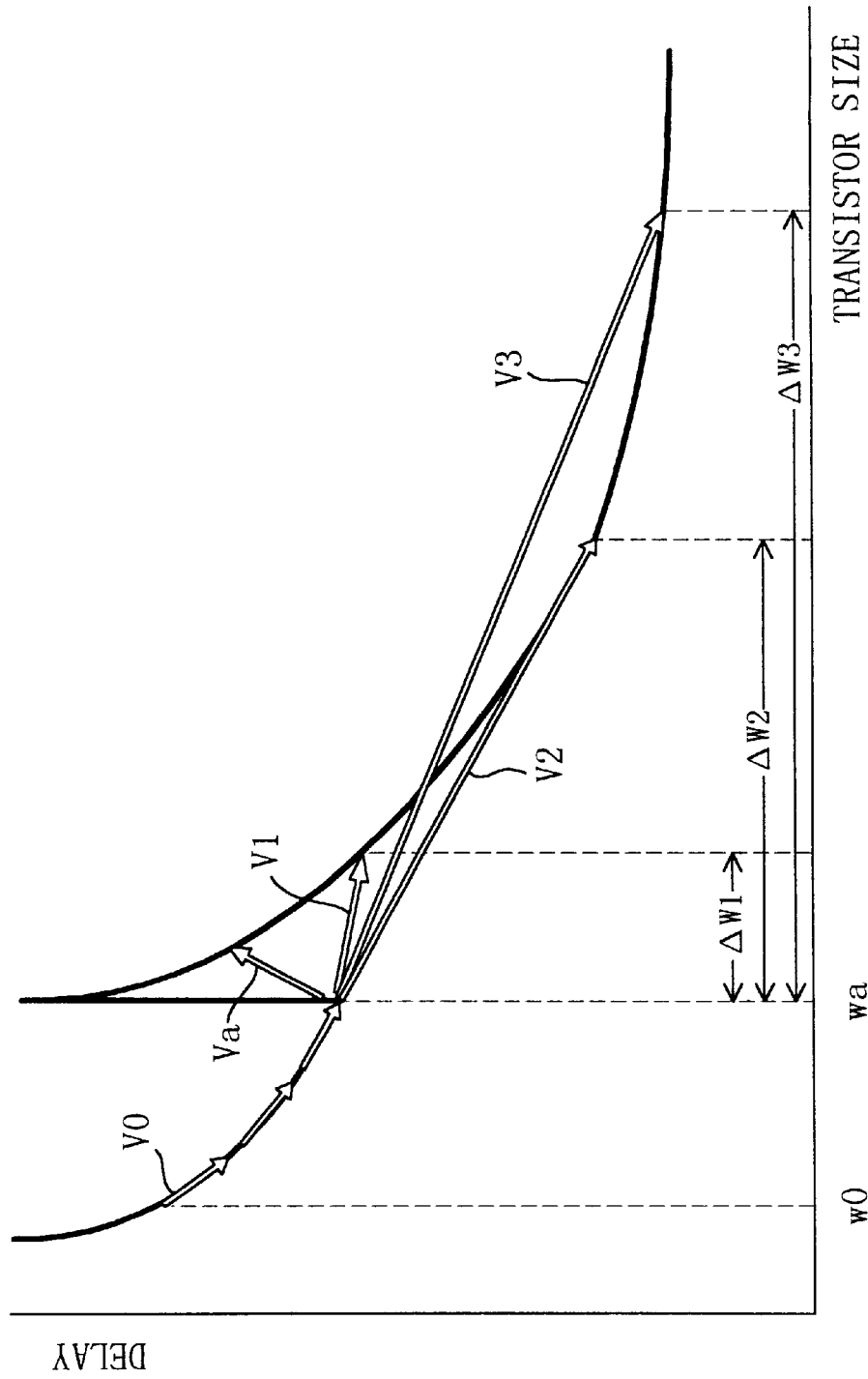
FIG. 29 is a graph schematically showing a transistor size optimization algorithm in a modified example of the present invention.

In view of such a disadvantage, this modified example prevents such a local solution from being generated by varying a differential (i.e., a predetermined increment or decrement value) between the older transistor size candidate and the newer substitutive transistor size candidate. FIG. 29 is a graph schematically showing the transistor size optimization algorithm in this modified example. In FIG. 29, the axis of ordinates indicates a delay and the axis of abscissas indicates a transistor size. The transistor size optimization algorithm of this modified example will be described with reference to FIG. 29.

First, the initial value of the transistor size candidate is set at a size W0 which is a permissible minimum size defined by a design rule. Next, the ratio of the decrement of delay to a predetermined increment value of the transistor size candidate, i.e., a delay reduction coefficient (represented by the slope of the arrow V0 shown in FIG. 29), is obtained. If the delay reduction coefficient is positive (i.e., if the delay has been decreased), the value of the transistor size candidate is increased by the predetermined increment value. Such processing is repeatedly performed until the delay reduction coefficient becomes negative.

When the delay reduction coefficient becomes negative, a plurality of increments, by any of which the value of a transistor size candidate is increased, are set as differential candidates. The delay reduction coefficients are obtained for the respective differential candidates thus set. And a differential candidate, for which the delay reduction coefficient becomes positive and maximum, is determined as the increment value of the transistor size candidate. For example, as shown in FIG. 29, when the delay reaches its relative minimum value because it becomes necessary to fold a transistor at a transistor size Wa, the delay reduction coefficient turns into negative as represented by the arrow Va. Thus, the three values ΔW1, ΔW2 and ΔW3 are set as the differential candidates. Since the delay reduction coefficient corresponding to the value ΔW2 is the maximum of the three delay reduction coefficients (represented by the slopes of the arrows V1, V2 and V3, respectively) corresponding to the respective differential candidates ΔW1, ΔW2 and ΔW3, the value ΔW2 is selected as the increment value of the transistor size candidate.

The above-described processing is continuously performed until the delay limitation has been satisfied or until the area limitation has been reached.

In this manner, the optimization algorithm of this modified example can prevent a local solution from being generated by varying a differential between the older transistor size candidate and the newer substitutive transistor size candidate, thereby determining an optimum transistor size.

As is apparent from the foregoing description, the present invention can determine an optimum transistor size for an integrated circuit, can minimize the area or the power consumption of the integrated circuit in accordance with the operating frequency thereof, and can optimize various characteristics, such as delay, of the circuit in accordance with the area thereof. Thus, the present invention is very advantageous in developing a library, in particular.

As a process has been developed rapidly, the libraries of standard cells, function macros and the like have also been developed with an even shorter cycle. In addition, as the types of designs have been diversified, an even wider variety of libraries are required to be developed in order to satisfy various demands such as reduction in power consumption and enhancement of the performance. However, in order to start to design an integrated circuit in accordance with a newly developed process as early as possible, it is critical to develop a library compatible with the process in a short period of time. Thus, the reduction in number of process steps required for developing a library is an urgent task to be solved.

The present invention can optimize the transistor size which greatly affects the area or the performance of a cell. Consequently, the present invention can reduce the number of process steps required for developing a library and can improve the performance of the library.

What is claimed is:

1. A layout designing apparatus for an integrated circuit, the apparatus receiving circuit data representing a configuration of the integrated circuit to be designed and technology data representing information about a semiconductor fabrication process, the apparatus comprising:

transistor size determination means for determining a size and a number of folded sections of each of a plurality of transistors, which constitute the integrated circuit, based on the circuit data and the technology data, while evaluating characteristics of the integrated circuit; and layout means for determining an arrangement of the transistors and wiring among the transistors based on the circuit data, the technology data, the transistor size and the number of folded sections, which size and number have been determined by the transistor size determination means, thereby producing a layout for the integrated circuit, said transistor size determination means comprising:

diffusion sharing estimation means for estimating, based on the circuit data, a diffusion-sharing region where diffusion sharing is implemented in the layout of the integrated circuit, when a given transistor size candidate is employed;

circuit characteristic evaluation means for evaluating the characteristics of the integrated circuit when the given transistor size candidate is employed based on the circuit data, the technology data and information about the diffusion-sharing region estimated by the diffusion sharing estimation means; and transistor size optimization means for setting transistor size candidates of the integrated circuit, in which the given transistor size candidate is included, providing the size candidates to the diffusion sharing estimation means and the circuit characteristic evaluation means, and then selecting an optimum transistor size from the transistor size candidates based on evaluation results of the circuit characteristic evaluation means, said circuit characteristic evaluation means comprising:

estimated delay calculation means for calculating, as an index for evaluating the characteristics of the integrated circuit, an estimated delay of the integrated circuit when the given transistor size candidate is employed, based on the circuit data, the technology data and the information about the diffusion-sharing region estimated by the diffusion sharing estimation means.

2. The layout designing apparatus for an integrated circuit of claim 1, wherein the circuit characteristic evaluation means further comprises:

estimated area calculation means for calculating, as an index for evaluating the characteristics of the integrated circuit, an estimated area of the integrated circuit when the given transistor size candidate is employed, based on the circuit data, the technology data and the information about the diffusion-sharing region estimated by the diffusion sharing estimation means.

3. The layout designing apparatus for an integrated circuit of claim 1, wherein the circuit characteristic evaluation means further comprises:

estimated consumed power calculation means for calculating, as an index for evaluating the characteristics of the integrated circuit, estimated power consumed by the integrated circuit when the given transistor size candidate is employed, based on the circuit data, the technology data and the information about the diffusion-sharing region estimated by the diffusion sharing estimation means.

4. A transistor size determining apparatus for determining a size of each of a plurality of transistors, which constitute an integrated circuit to be designed, the apparatus receiving circuit data representing a configuration of the integrated circuit and technology data representing information about a semiconductor fabrication process, the apparatus comprising:

diffusion sharing estimation means for estimating, based on the circuit data and a number of folded sections of each said transistor, a diffusion-sharing region where diffusion sharing is implemented in the layout of the integrated circuit when a given transistor size candidate is employed;

circuit characteristic evaluation means for evaluating the characteristics of the integrated circuit when the given transistor size candidate is employed, based on the circuit data, the technology data and information about the diffusion-sharing region estimated by the diffusion sharing estimation means; and transistor size optimization means for setting transistor size candidates of the integrated circuit, in which the given transistor size candidate is included, providing the size candidates to the diffusion sharing estimation means and the circuit characteristic evaluation means, and then selecting an optimum transistor size from the transistor size candidates based on evaluation results of the circuit characteristic evaluation means, said circuit characteristic evaluation means comprising:

estimated delay calculation means for calculating, as an index for evaluating the characteristics of the integrated circuit, an estimated delay of the integrated circuit when the given transistor size candidate is employed, based on the circuit data, the technology data and the information about the diffusion-sharing region estimated by the diffusion sharing estimation means.

5. The transistor size determining apparatus of claim 4, wherein the diffusion sharing estimation means estimates, as the diffusion-sharing region, at least one of: two mutually-connected diffusion regions of serially-connected transistors; two mutually-connected diffusion regions of transistors which are connected to each other via a branch; and one of diffusion regions of a transistor which is estimated to be folded.

6. The transistor size determining apparatus of claim 4, wherein the circuit characteristic evaluation means comprises estimated area calculation means for calculating, as an index for evaluating the characteristics of the integrated circuit, an estimated area of the integrated circuit when the given transistor size candidate is employed, based on the circuit data, the technology data and the information about the diffusion-sharing region estimated by the diffusion sharing estimation means.

7. The transistor size determining apparatus of claim 4, wherein the circuit characteristic evaluation means further comprises estimated consumed power calculation means for calculating, as an index for evaluating the characteristics of the integrated circuit, estimated power consumed by the integrated circuit when the given transistor size candidate is employed, based on the circuit data, the technology data and the information about the diffusion-sharing region estimated by the diffusion sharing estimation means.

* * * * *